(12) United States Patent
Seko

(10) Patent No.: US 11,849,640 B2
(45) Date of Patent: Dec. 19, 2023

(54) THERMOELECTRIC CONVERSION ELEMENT AND MANUFACTURING METHOD FOR THERMOELECTRIC CONVERSION ELEMENT

(71) Applicant: Tianma Japan, Ltd., Kanagawa (JP)

(72) Inventor: Nobuya Seko, Kanagawa (JP)

(73) Assignee: TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 18/073,258

(22) Filed: Dec. 1, 2022

(65) Prior Publication Data
US 2023/0180613 A1    Jun. 8, 2023

(30) Foreign Application Priority Data
Dec. 8, 2021 (JP) ................................. 2021-199328

(51) Int. Cl.
*H10N 10/82* (2023.01)
*H10N 10/01* (2023.01)

(52) U.S. Cl.
CPC ............. *H10N 10/82* (2023.02); *H10N 10/01* (2023.02)

(58) Field of Classification Search
USPC ......................................................... 136/225
See application file for complete search history.

(56) References Cited

U.S. PATENT DOCUMENTS

| 6,043,423 A * | 3/2000 | Satomura ............... H10N 10/17 136/211 |
| 6,335,478 B1 * | 1/2002 | Chou ..................... H10N 10/00 136/201 |
| 2018/0226559 A1 * | 8/2018 | Shibata .................. H10N 10/81 |

FOREIGN PATENT DOCUMENTS

JP            6513476 B2    5/2019

* cited by examiner

*Primary Examiner* — Andrew J Golden
(74) *Attorney, Agent, or Firm* — Sughrue Mion, PLLC

(57) ABSTRACT

Thermoelectric conversion cells of a thermoelectric conversion element include a thermoelectric conversion layer formed on a main surface of a substrate, an insulating layer covering the thermoelectric conversion layer, a first electrode including a first layer and a second layer, and a second electrode. The first layer connects to the main surface of the thermoelectric conversion layer via a first contact hole, and the second layer covers the first layer. The second electrode connects to the main surface of the thermoelectric conversion layer via a second contact hole. The second layer and the second electrode, and the first layer are formed from materials having different work functions. In thermoelectric conversion cells that are adjacent to each other, the second layer of one of the thermoelectric conversion cells and the second electrode of the other of the thermoelectric conversion cells are formed integrally, and the thermoelectric conversion cells are connected in series.

4 Claims, 22 Drawing Sheets

THERMOELECTRIC CONVERSION ELEMENT AND MANUFACTURING METHOD FOR THERMOELECTRIC CONVERSION ELEMENT

CROSS-REFERENCE TO RELATED APPLICATION

This application claims the benefit of Japanese Patent Application No. 2021-199328, filed on Dec. 8, 2021, the entire disclosure of which is incorporated by reference herein.

FIELD

The present disclosure relates generally to a thermoelectric conversion element and a manufacturing method for thermoelectric conversion element.

BACKGROUND

In the related art, thermoelectric conversion elements are known that generate thermoelectromotive force between two electrodes due to temperature differences. For example, Japanese Patent No. 6513476 describes a thermoelectric conversion element including a thin film-like thermoelectric conversion material layer, a first electrode provided on one main surface of the thermoelectric conversion material layer, and a second electrode provided at a location, different than that of the first electrode, in an in-plane direction of the one main surface of the thermoelectric conversion material layer. In Japanese Patent No. 6513476, the work function of the material constituting the first electrode and the work function of the material constituting the second electrode are different.

Japanese Patent No. 6513476 indicates that an open-end voltage value of the thermoelectric conversion element at a temperature difference of 70° C. is 0.38 mV. This open-end voltage value is about 1/10 the open-end voltage value of a Peltier-type heat flux sensor in which the cells are connected in series, under the same conditions. Accordingly, when using the thermoelectric conversion element of Japanese Patent No. 6513476 as a heat flux sensor, it is preferable that thermoelectric conversion elements be connected in series in order to ensure the S/N ratio of the heat flux sensor. Furthermore, it is desirable to miniaturize the thermoelectric conversion element in order to increase the number of thermoelectric conversion elements per unit area. With the thermoelectric conversion element of Japanese Patent No. 6513476, the short-circuit current can be increased by narrowing the spacing between the first electrode and the second electrode and, as such, from this perspective as well, it is desirable that the thermoelectric conversion element be miniaturized.

However, several problems may arise when miniaturizing the thermoelectric conversion element of Japanese Patent No. 6513476 by photolithography and etching. For example, when forming the first electrode on the one main surface of the thermoelectric conversion material layer, the material constituting the thermoelectric conversion material layer and the material constituting the first electrode are different, and the thermoelectric conversion material layer and the first electrode that have different electrode potentials are in a conducting state. As such, in the etching solution, a galvanic cell is formed between the thermoelectric conversion material layer and the first electrode. A galvanic cell is an electrochemical cell that uses chemical reaction to produce electrical energy. As a result, current flows between the thermoelectric conversion material layer and the first electrode on the basis of the potential difference (difference between electrode potentials) between the thermoelectric conversion material layer and the first electrode, which may lead to dissolving of the thermoelectric conversion material layer, abnormal dissolving of the material constituting the first electrode, and the like. Additionally, when forming the second electrode on the one main surface of the thermoelectric conversion material layer on which the first electrode is formed, in the etching solution, current flows between the thermoelectric conversion material layer, the first electrode, and the second electrode, which may lead to dissolving of the thermoelectric conversion material layer and the first electrode, abnormal dissolving of the material constituting the second electrode, and the like.

SUMMARY

A thermoelectric conversion element according to a first aspect includes:
  a substrate; and
  a plurality of thermoelectric conversion cells provided on a main surface of the substrate, wherein
  each of the thermoelectric conversion cells includes
    a thermoelectric conversion layer formed on the main surface of the substrate,
    an insulating layer covering the thermoelectric conversion layer,
    a first electrode formed on the insulating layer and including a first layer connecting to a main surface of the thermoelectric conversion layer via a first contact hole of the insulating layer, and a second layer formed on the insulating layer and covering the first layer, and
    a second electrode formed on the insulating layer and connecting to the main surface of the thermoelectric conversion layer via a second contact hole of the insulating layer,
  the second layer covers the first layer in a state in which the first layer is not exposed from the second layer,
  the second layer and the second electrode are formed from an identical material that has a work function that is different from a work function of a material forming the first layer, and
  in the thermoelectric conversion cells that are adjacent to each other, the second layer of one of the thermoelectric conversion cells and the second electrode of another of the thermoelectric conversion cells are formed integrally, the first electrode and the second electrode are connected one-to-one, and the plurality of thermoelectric conversion cells is connected in series.

A manufacturing method for the thermoelectric conversion element according to a second aspect includes:
  forming a plurality of thermoelectric conversion layers on a substrate;
  forming an insulating layer on the plurality of thermoelectric conversion layers;
  forming, on the insulating layer, a plurality of first contact holes that corresponds to each of the thermoelectric conversion layers and that exposes a main surface of each of the thermoelectric conversion layers;
  forming, on the insulating layer, a first layer of each of a plurality of first electrodes that corresponds to each of the thermoelectric conversion layers and connects to the main surface of each of the thermoelectric conversion layers via the first contact holes;

forming, on the insulating layer on which the first layer of each of the first electrodes is formed, a plurality of second contact holes that corresponds to each of the thermoelectric conversion layers and exposes the main surface of each of the thermoelectric conversion layers; and forming a plurality of thermoelectric conversion cells by forming, on the insulating layer, both a plurality of second electrodes, that corresponds to each of the thermoelectric conversion layers and connects to the main surface of each of the thermoelectric conversion layers via the second contact holes, and a second layer of each of the plurality of first electrodes that covers the first layer of each of the first electrodes from a material having a work function that is different from a work function of a material forming the first layer of each of the first electrodes, each of thermoelectric conversion cells including the thermoelectric conversion layer, the insulating layer, the first electrode, and the second electrode, wherein in the forming of the plurality of thermoelectric conversion cells, the second layer of each of the first electrodes is formed in a state in which the first layer of each of the first electrodes is not exposed from the second layer of each of the first electrodes, and in the thermoelectric conversion cells that are adjacent to each other, the second layer of the first electrode of one of the thermoelectric conversion cells and the second electrode of another of the thermoelectric conversion cells are formed integrally, the first electrode and the second electrode are connected one-to-one, and the plurality of thermoelectric conversion cells is connected in series.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which.

DETAILED DESCRIPTION

Hereinafter, a thermoelectric conversion element according to embodiments is described while referencing the drawings.

Embodiment 1

Figure 1:
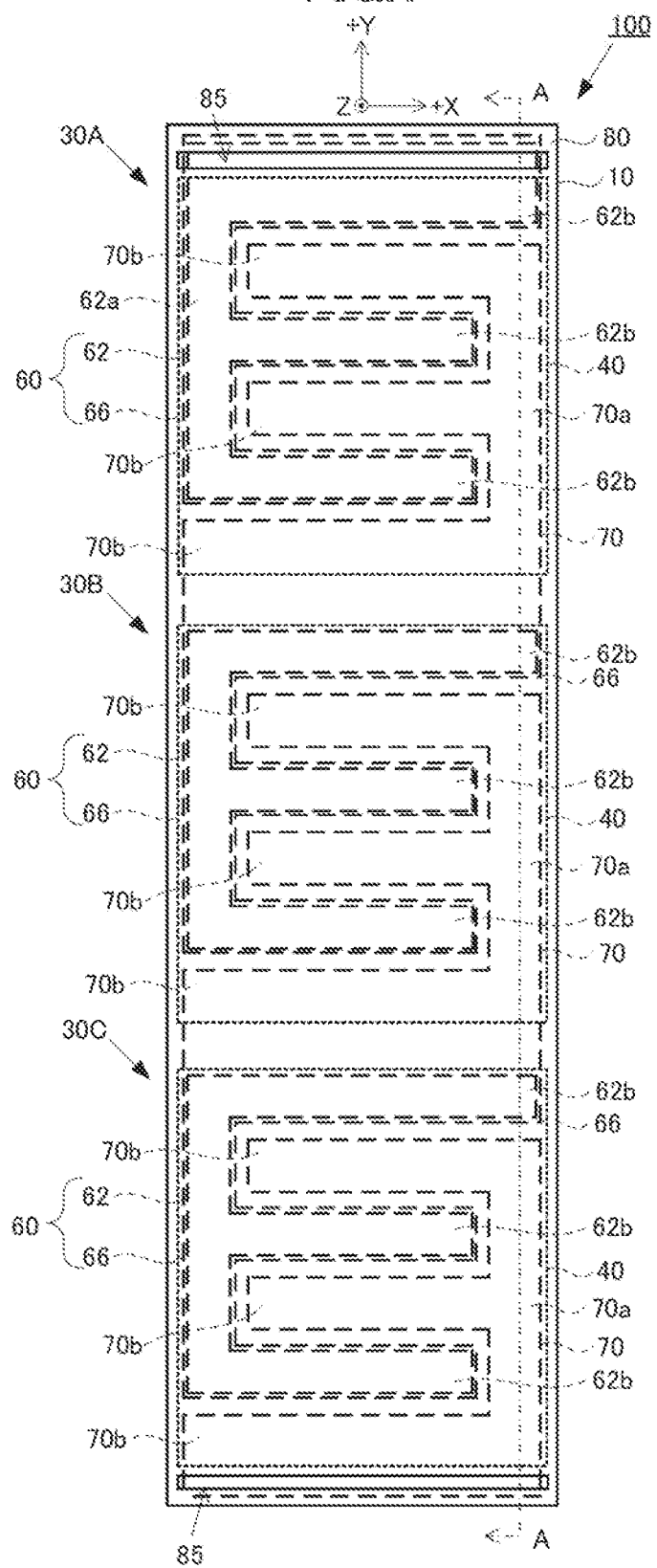
FIG. 1 is a top view illustrating a thermoelectric conversion element according to Embodiment 1.
Figure 2:
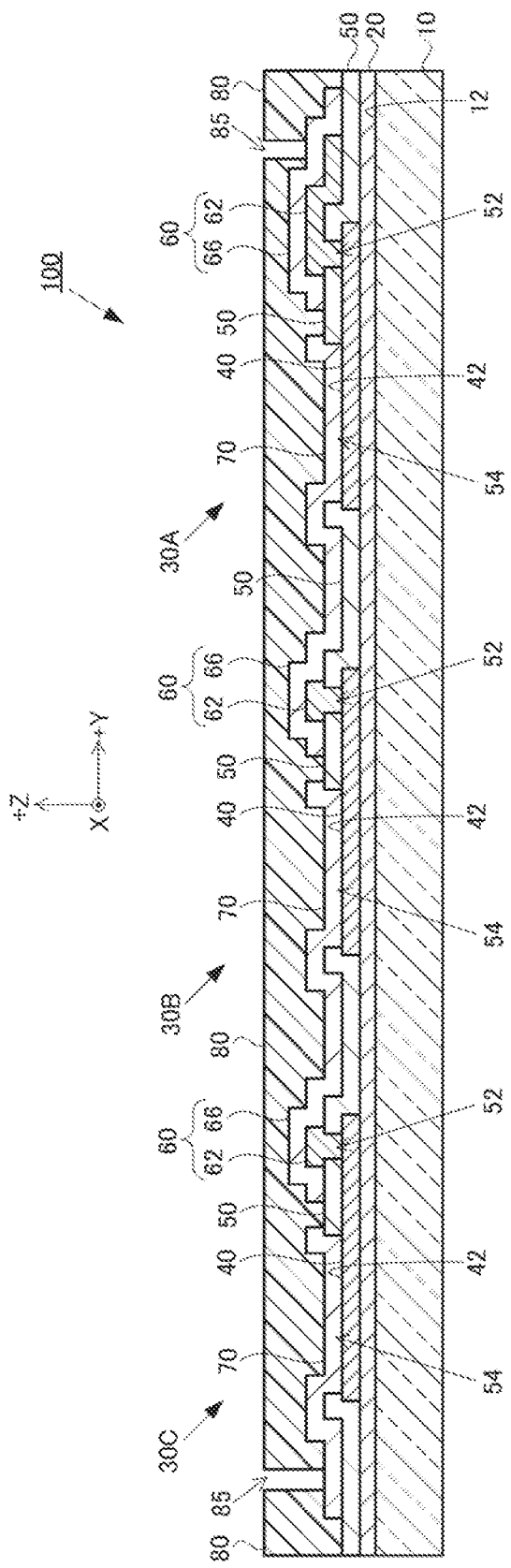
FIG. 2 is a cross-sectional view of the thermoelectric conversion element illustrated in FIG. 1, taken along line A-A.

A thermoelectric conversion element 100 according to the present embodiment is described while referencing FIGS. 1 to 16. As illustrated in FIGS. 1 and 2, the thermoelectric conversion element 100 includes a substrate 10, a base layer 20, three thermoelectric conversion cells 30A to 30C, and a protection layer 80. The thermoelectric conversion cells 30A to 30C are connected in series in one row. Each of the thermoelectric conversion cells 30A to 30C includes a thermoelectric conversion layer 40, an insulating layer 50, a first electrode 60, and a second electrode 70. The first electrode 60 includes a first layer 62 and a second layer 66. The second layer 66 and the second electrode 70 are formed from the same material. This material has a work function different from the work function of the material forming the first layer 62. Note that, to facilitate comprehension, the base layer 20, the insulating layer 50, first contact holes 52, and second contact holes 54 are omitted from FIG. 1.

The thermoelectric conversion element 100 (the thermoelectric conversion cells 30A to 30C) produces thermoelectromotive force due to a temperature difference in the thickness direction of the thermoelectric conversion layer 40. That is, the thermoelectric conversion element 100 (the thermoelectric conversion cells 30A to 30C) converts heat energy to electrical energy. In one example, the thermoelectric conversion element 100 is used as a sensor that detects heat flux. Note that, in the present description, to facilitate comprehension, for the thermoelectric conversion element 100 of FIG. 1, the right direction (the right direction on paper) is referred to as the "+X direction", the up direction (the up direction on paper) is referred to as the "+Y direction", and the direction perpendicular to the +X direction and the +Y direction (the front direction on paper) is referred to as the "+Z direction" (the thickness direction).

In one example, the substrate 10 of the thermoelectric conversion element 100 is implemented as a flat plate-like glass substrate. In order to reduce thermal resistance in the thickness direction (the +Z direction), it is preferable that the substrate 10 is formed from a material that has high thermal conductivity.

The base layer 20 of the thermoelectric conversion element 100 is provided on a first main surface 12 of the substrate 10. In the present embodiment, the base layer 20 is provided on an entirety of the first main surface 12. In one example, the base layer 20 is formed from silicon oxide (SiOx).

The thermoelectric conversion cells 30A to 30C of the thermoelectric conversion element 100 are formed on the first main surface 12 of the substrate 10. The thermoelectric conversion cells 30A to 30C are connected in series in one row. Since the thermoelectric conversion cells 30A to 30C are connected in series, the open-end voltage of the thermoelectric conversion element 100 can be increased.

Firstly, the configuration of the thermoelectric conversion cells 30A to 30C is described using the thermoelectric conversion cell 30B as an example. The thermoelectric conversion cells 30A and 30C have the same configuration as the thermoelectric conversion cell 30B.

As illustrated in FIG. 2, the thermoelectric conversion cell 30B includes the thermoelectric conversion layer 40, the insulating layer 50, the first electrode 60, and the second electrode 70. The first electrode 60 includes the first layer 62 and the second layer 66.

The thermoelectric conversion layer 40 of the thermoelectric conversion cell 30B is provided in a rectangular shape on the base layer 20. The thermoelectric conversion layer 40 is formed from an n-type or a p-type thermoelectric conversion material. Examples of the n-type thermoelectric conversion material include indium gallium zinc oxide (InGaZnO). Examples of the p-type thermoelectric conversion material include magnesium silicide ($Mg_2Si$) with added silver (Ag). In the present embodiment, the thermoelectric conversion layer 40 is formed from indium gallium zinc oxide.

On a first main surface 42 of the thermoelectric conversion layer 40 (the main surface on the side opposite the substrate 10), the thermoelectric conversion layer 40 and the first electrode 60 (the first layer 62), and the thermoelectric conversion layer 40 and the second electrode 70 connect. The first electrode 60 (the first layer 62) and the second electrode 70 are connected to the thermoelectric conversion layer 40 at a different location of the first main surface 42.

Figure 3:
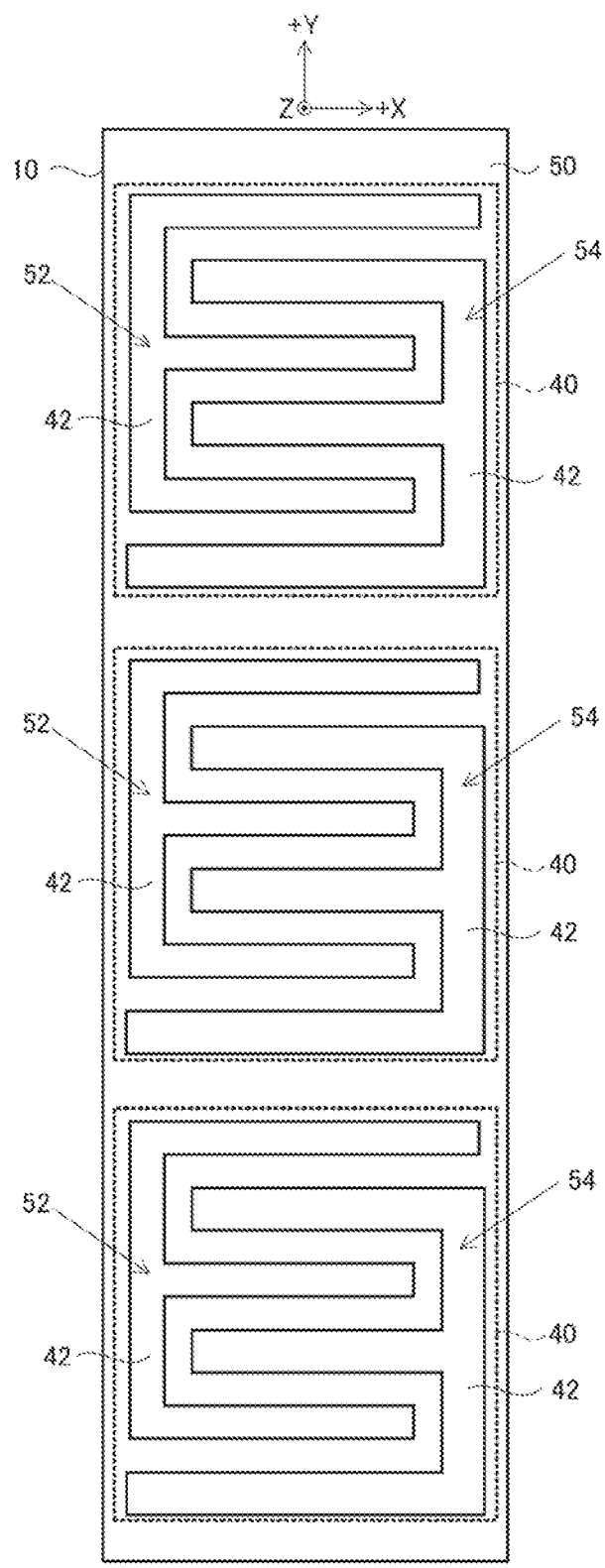
FIG. 3 is a top view illustrating an insulating layer according to Embodiment 1.

The insulating layer 50 of the thermoelectric conversion cell 30B covers the thermoelectric conversion layer 40 and the base layer 20. As illustrated in FIG. 3, a comb teeth-shaped first contact hole 52 is formed in the insulating layer 50 in order to connect the first electrode 60 (the first layer 62) to the thermoelectric conversion layer 40. Additionally, a comb teeth-shaped second contact hole 54 is formed in the insulating layer 50 in order to connect the second electrode 70 to the thermoelectric conversion layer 40. In one example, the insulating layer 50 is formed from silicon oxide (SiOx). Note that the base layer 20 is omitted from FIG. 3. The base layer 20 is sometimes omitted from the hereinafter referenced top views as well.

As illustrated in FIG. 2, the first electrode 60 of the thermoelectric conversion cell 30B is formed on the insulating layer 50. The first electrode 60 connects to the first main surface 42 of the thermoelectric conversion layer 40 via the first contact hole 52 of the insulating layer 50. The first electrode 60 includes the first layer 62 and the second layer 66.

The first layer 62 of the first electrode 60 is connected to the first main surface 42 of the thermoelectric conversion layer 40 via the first contact hole 52 of the insulating layer 50. The first layer 62 covers the opening of the first contact hole 52 in a state in which the thermoelectric conversion layer 40, which is exposed from the insulating layer 50 at the bottom of the first contact hole 52, is not exposed from the first layer 62.

As illustrated in FIG. 1, the first layer 62 is formed in a comb teeth shape. The first layer 62 includes a first base 62a extending in the Y direction, and a plurality of first comb teeth 62b extending in the +X direction from the first base 62a. The first comb teeth 62b and second comb teeth 70b of the second electrode 70 (described later) are disposed facing each other in an alternating manner on the first main surface 42 of the thermoelectric conversion layer 40. In the present embodiment, from the +Y side, a first comb tooth 62b, a second comb tooth 70b, a first comb tooth 62b, a second comb tooth 70b, a first comb tooth 62b, and a second comb tooth 70b are arranged, in this order. In one example, the first layer 62 is formed from titanium (Ti) that has a small work function.

In the present embodiment, the insulating layer 50 covers the thermoelectric conversion layer 40. Additionally, the first layer 62 of the first electrode 60 formed on the insulating layer 50 is connected to the first main surface 42 of the thermoelectric conversion layer 40 via the first contact hole 52 of the insulating layer 50. Due to this configuration, when forming the first layer 62 by etching, the thermoelectric conversion layer 40 is not exposed from the insulating layer 50, and the thermoelectric conversion layer 40 is not exposed to the etching solution. Since the thermoelectric conversion layer 40 is not exposed to the etching solution, galvanic cells are not formed by the first layer 62, the etching solution, and the thermoelectric conversion layer 40 in the thermoelectric conversion cell 30B (the thermoelectric conversion element 100). Accordingly, the first layer 62 can be formed by etching without causing damage (for example, excessive dissolving) due to galvanic effects to the first layer 62 and the thermoelectric conversion layer 40.

As illustrated in FIGS. 1 and 2, the second layer 66 of the first electrode 60 covers the first layer 62 in a state in which the first layer 62 is not exposed from the second layer 66. Additionally, the second layer 66 is formed together with the second electrode 70 from the same material as the material forming the second electrode 70. Due to this configuration, the first layer 62 is not exposed to the etching solution when forming the second layer 66 by etching. Since the first layer 62 is not exposed to the etching solution, galvanic cells are not formed by the second layer 66, the etching solution, and the first layer 62 in the thermoelectric conversion cell 30B (the thermoelectric conversion element 100). Accordingly, the second electrode 70 can be formed by etching without causing damage due to galvanic effects to the first layer 62 and the second layer 66. The material that forms the second layer 66 and the second electrode 70 is described later.

The second electrode 70 of the thermoelectric conversion cell 30B is formed on the insulating layer 50, and connects to the first main surface 42 of the thermoelectric conversion layer 40 via the second contact hole 54 of the insulating layer 50. The second electrode 70 and the first electrode 60 (the first layer 62) do not connect to each other on the first main surface 42. The second electrode 70 is connected to the first main surface 42 at a location that is different from the location of the first main surface 42 where the first electrode 60 is connected. The second electrode 70 covers the opening of the second contact hole 54 in a state in which the thermoelectric conversion layer 40, which is exposed from the insulating layer 50 at the bottom of the second contact hole 54, is not exposed from the second electrode 70.

As illustrated in FIG. 1, the second electrode 70 is formed in a comb teeth shape. The second electrode 70 includes a second base 70a extending in the Y direction, and a plurality of second comb teeth 70b extending in the −X direction from the second base 70a. The second comb teeth 70b and the first comb teeth 62b of the first layer 62 of the first electrode 60 are disposed facing each other in an alternating manner on the first main surface 42 of the thermoelectric conversion layer 40.

The second electrode 70 and the second layer 66 of the first electrode 60 are formed from the same material. This material has a work function that is different from the work function of the material forming the first layer 62 of the first electrode 60. In one example, the second electrode 70 and the second layer 66 of the first electrode 60 are formed from copper (Cu) that has a large work function.

In the present embodiment, the insulating layer 50 covers the thermoelectric conversion layer 40, and the second electrode 70 formed on the insulating layer 50 connects to the first main surface 42 of the thermoelectric conversion layer 40 via the second contact holes 54 of the insulating layer 50. As such, the thermoelectric conversion layer 40 is not exposed to the etching solution when forming the second electrode 70 by etching. Additionally, the first layer 62 of the first electrode 60 is covered by the second layer 66 that is formed together with the second electrode 70 and, as such, the first layer 62 is not exposed to the etching solution when forming the second electrode 70 (the second layer 66) by etching. Since the thermoelectric conversion layer 40 and the first layer 62 are not exposed to the etching solution, galvanic cells are not formed by the second electrode 70, the etching solution, and the thermoelectric conversion layer 40, and galvanic cells are not formed by the second electrode 70, the etching solution, and the first layer 62. As a result, in the thermoelectric conversion element 100, the second electrode 70 can be formed by etching without causing damage due to galvanic effects to the thermoelectric conversion layer 40, the first layer 62, the second layer 66, and the second electrode 70.

Next, arrangements and connections of the thermoelectric conversion cells 30A to 30C are described. As illustrated in FIG. 1, the thermoelectric conversion cells 30A to 30C are arranged in the same direction and same orientation when viewed from above, with the first comb teeth 62b facing the +X direction and the second comb teeth 70b facing the −X direction. Additionally, the thermoelectric conversion cells 30A to 30C are arranged in one row in the Y direction.

In the thermoelectric conversion cell 30A and the thermoelectric conversion cell 30B that are adjacent to each other, the second electrode 70 of the thermoelectric conversion cell 30A and the second layer 66 of the thermoelectric conversion cell 30B are formed integrally, and the second electrode 70 of the thermoelectric conversion cell 30A and the first electrode 60 of the thermoelectric conversion cell 30B are connected one-to-one. Additionally, in the thermoelectric conversion cell 30B and the thermoelectric conversion cell 30C that are adjacent to each other, the second electrode 70 of the thermoelectric conversion cell 30B and the second layer 66 of the thermoelectric conversion cell 30C are formed integrally, and the second electrode 70 of the thermoelectric conversion cell 30B and the first electrode 60 of the thermoelectric conversion cell 30C are connected one-to-one. Due to this configuration, the thermoelectric conversion cells 30A to 30C are connected in series in one row. In the present embodiment, the second electrode 70 of one of the thermoelectric conversion cells that are adjacent to each other (the thermoelectric conversion cell 30A and the thermoelectric conversion cell 30B, and the thermoelectric conversion cell 30B and the thermoelectric conversion cell 30C) and the second layer 66 of the other thermoelectric conversion cell are formed integrally, thereby connecting the plurality of thermoelectric conversion cells 30A to 30C. As such, the plurality of thermoelectric conversion cells 30A to 30C can easily be connected in series.

With the thermoelectric conversion element 100, in each of the thermoelectric conversion cells 30A to 30C that are connected in series in one row, the first layer 62 of the first electrode 60 and the second electrode 70, for which the work functions of the forming materials differ, are connected to the first main surface 42 of the thermoelectric conversion layer 40, and thermoelectromotive force is generated due to the temperature difference in the thickness direction (the Z direction) of the thermoelectric conversion layer 40. Since the thermoelectric conversion cells 30A to 30C are connected in series, the thermoelectromotive force of each of the thermoelectric conversion cells 30A to 30C is added, thereby making it possible to increase the overall open-end voltage of the thermoelectric conversion element 100. Additionally, with the thermoelectric conversion element 100, the thermoelectric conversion layer 40 and the first layer 62 are not damaged, even when the first layer 62 of the first electrode 60 is formed by etching. Furthermore, the thermoelectric conversion layer 40, the first layer 62, the second layer 66, and the second electrode 70 are not damaged, even when the second layer 66 of the first electrode 60 and the second electrode 70 are formed by etching. Accordingly, the thermoelectric conversion element 100 including the thermoelectric conversion cells 30A to 30C connected in series in one row can easily be miniaturized by photolithography and etching.

The protection layer 80 of the thermoelectric conversion element 100 protects the first electrode 60, the second electrode 70, and the like. In one example, the protection layer 80 is formed from a photosensitive polyimide. Note that, as illustrated in FIG. 1, terminal openings 85 are provided on the protection layer 80. The terminal openings 85 are for connecting the first electrode 60 of the thermoelectric conversion cell 30A and the second electrode 70 of the thermoelectric conversion cell 30C to an external device.

Figure 4:
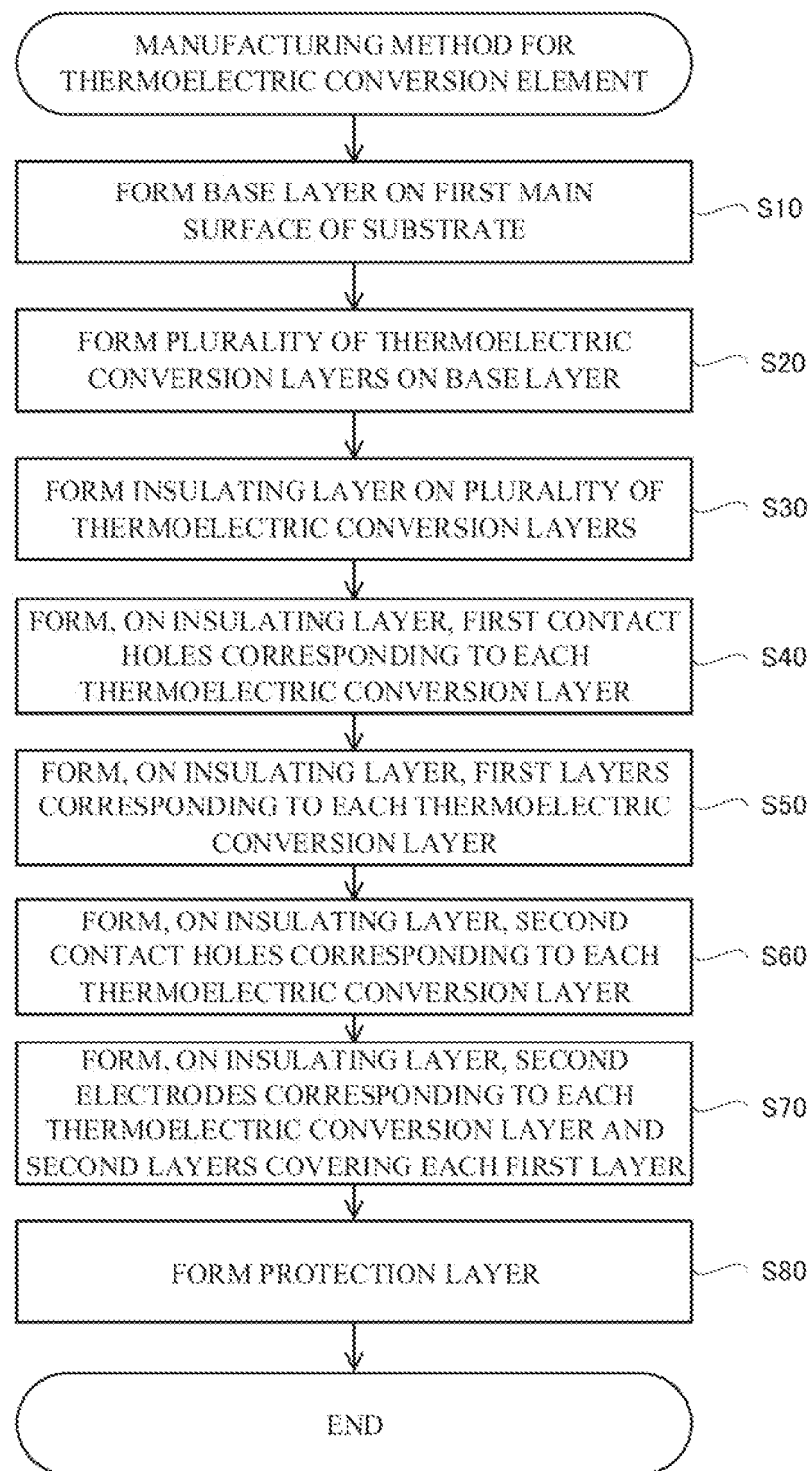
FIG. 4 is a flowchart illustrating a manufacturing method of the thermoelectric conversion element according to Embodiment 1.

Next, a manufacturing method for the thermoelectric conversion element 100 is described while referencing FIGS. 4 to 16. FIG. 4 is a flowchart illustrating the manufacturing method for the thermoelectric conversion element 100. The manufacturing method for the thermoelectric conversion element 100 includes a step of forming a base layer 20 on a first main surface 12 of a substrate 10 (step S10); a step of forming a plurality of thermoelectric conversion layers 40 on the base layer 20 (on a first main surface 12 of the substrate 10) (step S20); a step of forming an insulating layer 50 on the plurality of thermoelectric conversion layers 40 (step S30); a step of forming, on the insulating layer 50, a first contact hole 52 corresponding to each of the thermoelectric conversion layers 40 (step S40); and a step of forming, on the insulating layer 50, a first layer 62 of a plurality of first electrodes 60 that corresponds to each of the thermoelectric conversion layers 40 and connects to a first main surface 42 of each of the thermoelectric conversion layers 40 via the first contact holes 52 (step S50).

The manufacturing method for the thermoelectric conversion element 100 further includes a step of forming, on the insulating layer 50 on which the first layer 62 of each of the first electrodes 60 is formed, a second contact hole 54 corresponding to each of the thermoelectric conversion layers 40 (step S60); a step of forming a plurality of thermoelectric conversion cells 30A to 30C by forming, on the insulating layer 50, both a plurality of second electrodes 70, that corresponds to each of the thermoelectric conversion layers 40 and connects to the main surface 42 of each of the thermoelectric conversion layers 40 via the second contact hole 54, and a second layer 66 of the plurality of first electrodes 60 that covers the first layer 62 of each of the first electrodes 60 from a material having a work function that is different from the work function of the material forming the first layer 62 of each of the first electrodes 60, each of thermoelectric conversion cells 30A to 30C including the thermoelectric conversion layer 40, the insulating layer 50, the first electrode 60, and the second electrode 70 (step S70); and a step of forming a protection layer 80 (step S80).

Figure 5:
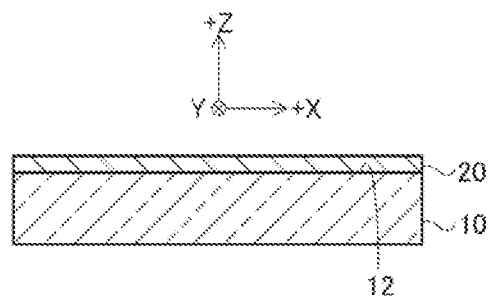
FIG. 5 is a cross-sectional view illustrating a base layer according to Embodiment 1.

In step S10, firstly, the substrate 10 is prepared. Next, as illustrated in FIG. 5, the base layer 20 is formed on the first main surface 12 of the substrate 10. In one example, the base layer 20 is formed from silicon oxide by sputtering on the entire surface of the first main surface 12.

Figure 6:
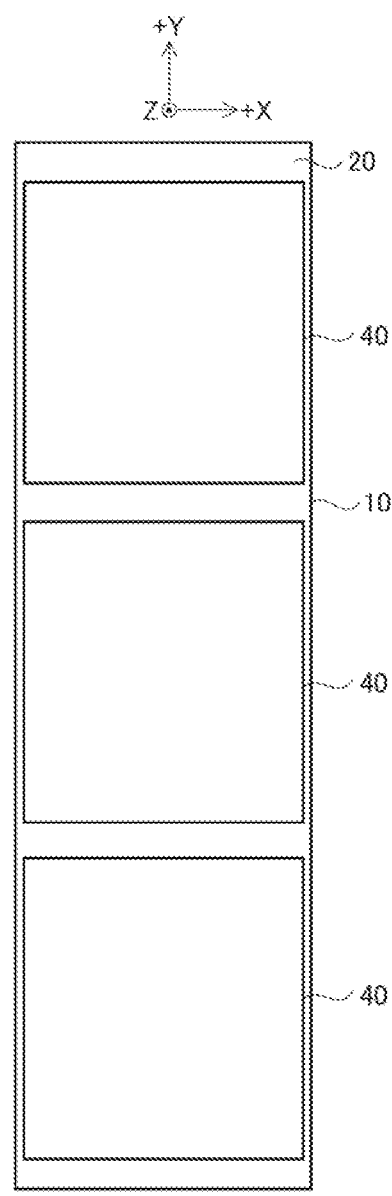
FIG. 6 is a top view illustrating a thermoelectric conversion layer according to Embodiment 1.

In step S20, as illustrated in FIG. 6, three rectangular thermoelectric conversion layers 40 are formed on the base layer 20. Specifically, firstly, a thermoelectric conversion film is formed from indium gallium zinc oxide by sputtering on the entire surface of the base layer 20. Then, the thermoelectric conversion layers 40 are formed from the thermoelectric conversion film by photolithography and etching.

Figure 7:
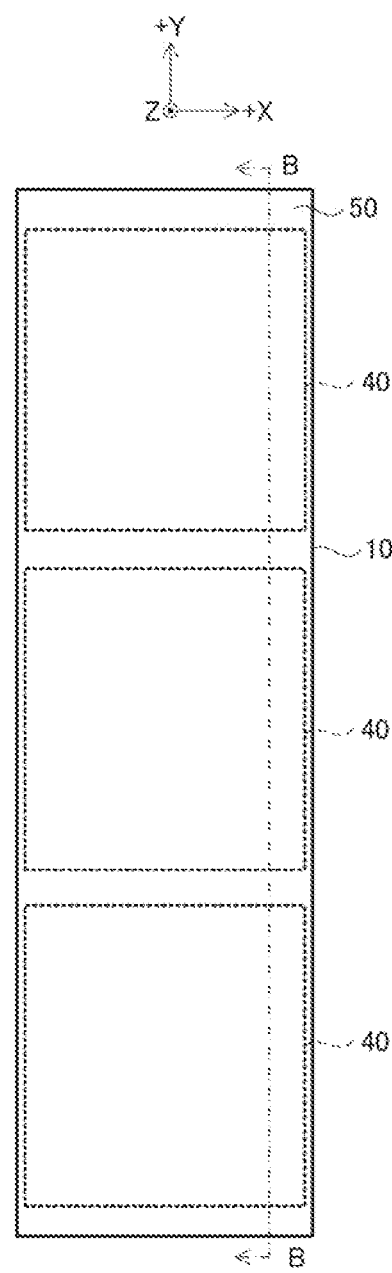
FIG. 7 is a top view illustrating the insulating layer and the thermoelectric conversion layer according to Embodiment 1.
Figure 8:
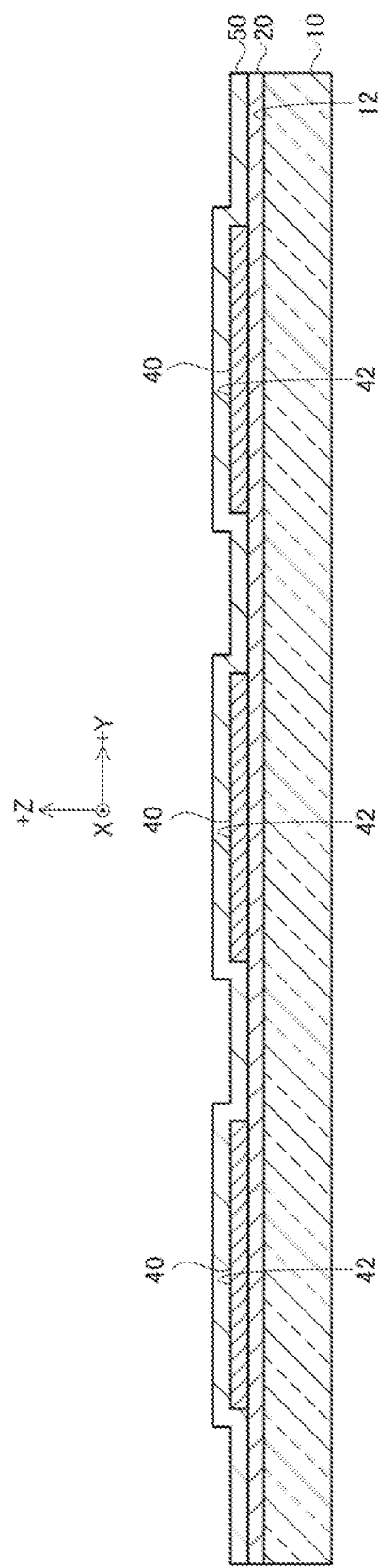
FIG. 8 is a cross-sectional view of the insulating layer and the thermoelectric conversion layer illustrated in FIG. 7, taken along line B-B.

In step S30, as illustrated in FIGS. 7 and 8, the insulating layer 50 is formed on the plurality of thermoelectric conversion layers 40 and on the base layer 20. Specifically, the insulating layer 50 is formed from silicon oxide by chemical vapor deposition (CVD), on the entire surface of the base layer 20 and the thermoelectric conversion layers 40. Here, the thermoelectric conversion layers 40 are covered by the insulating layer 50 in a state in which the thermoelectric conversion layers 40 are not exposed from the insulating layer 50.

Figure 9:
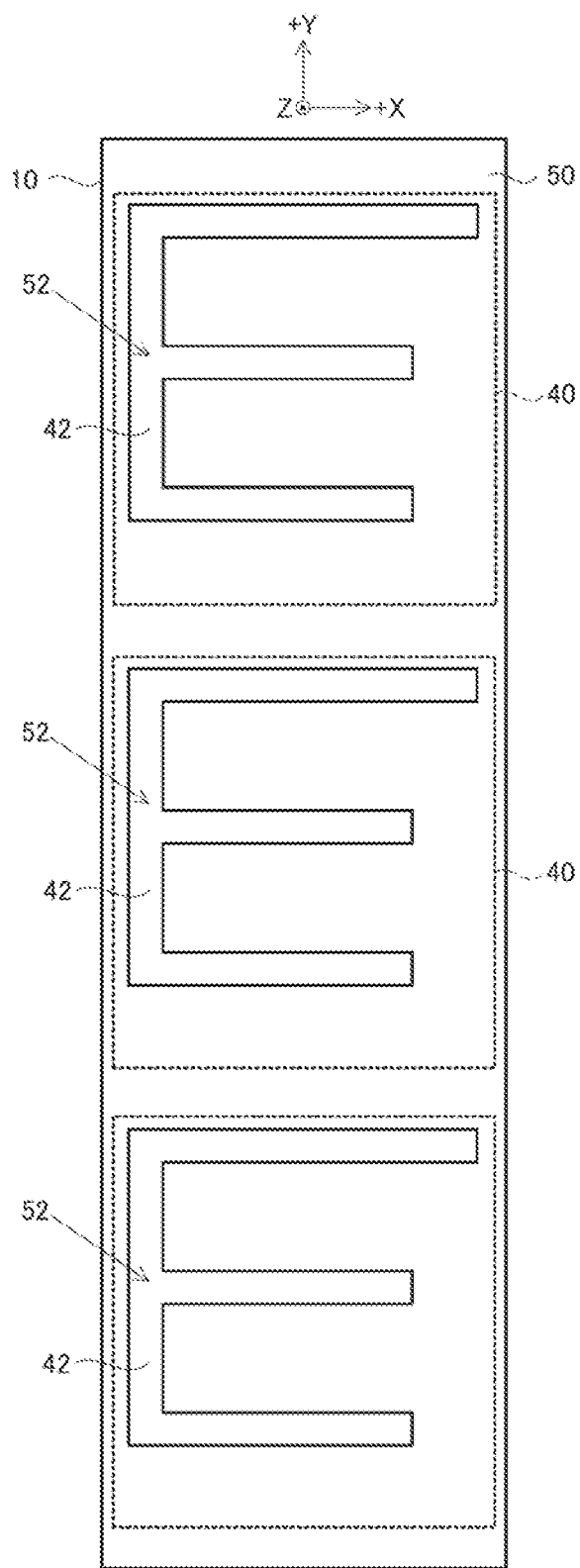
FIG. 9 is a top view illustrating a first contact hole of Embodiment 1.

In step S40, the first contact hole 52 corresponding to each of the thermoelectric conversion layers 40 is formed on the insulating layer 50 by photolithography and etching. In the present embodiment, as illustrated in FIG. 9, the first contact hole 52 is formed in a comb teeth shape so as to match the shape of the first layer 62 of each of the first electrodes 60. Due to this configuration, the first main surface 42 of each of the thermoelectric conversion layers 40 is exposed from the insulating layer 50 in a comb teeth shape.

Figure 10:
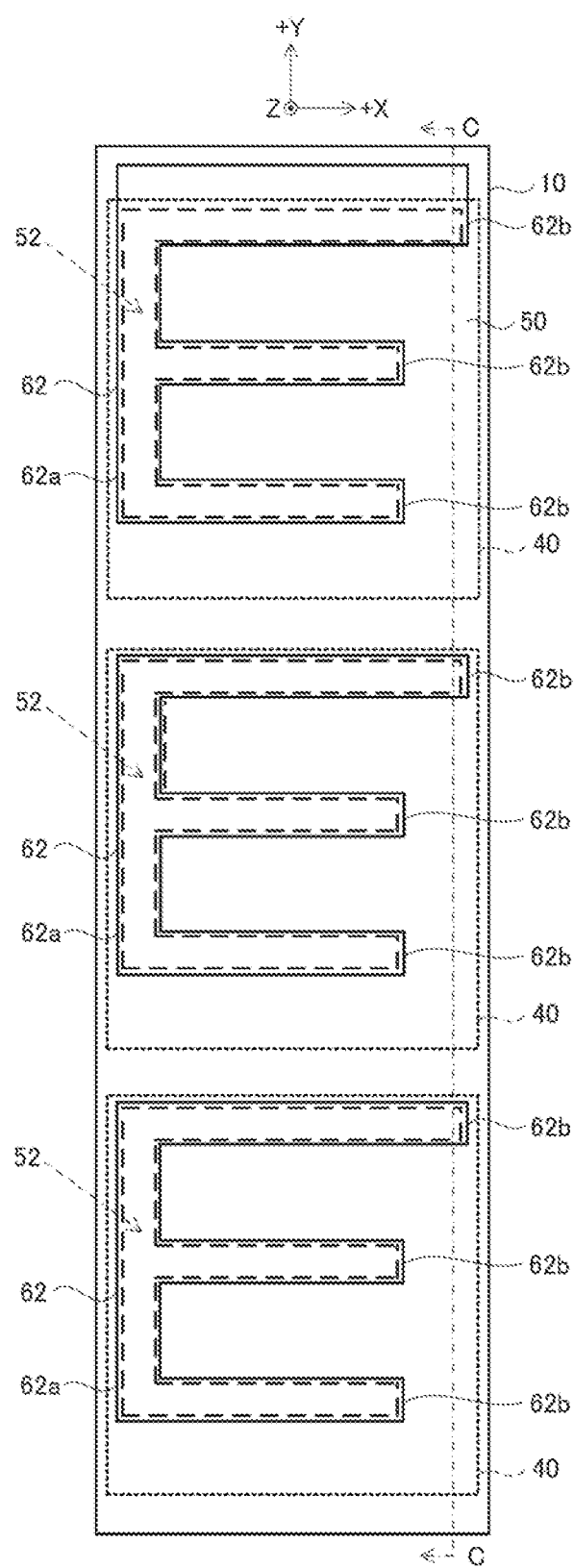
FIG. 10 is a top view illustrating a first layer of a first electrode according to Embodiment 1.
Figure 11:
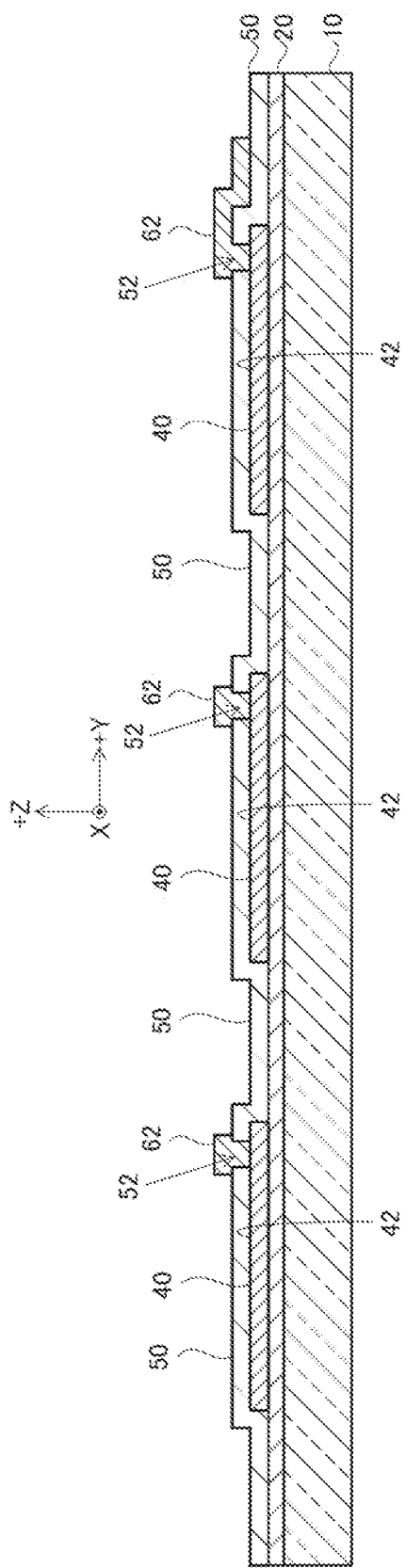
FIG. 11 is a cross-sectional view of the first layer of the first electrode illustrated in FIG. 10, taken along line C-C.

In step S50, as illustrated in FIGS. 10 and 11, the first layer 62 of each of the first electrodes 60 that corresponds to each of the thermoelectric conversion layers 40 is formed on the insulating layer 50. The first layer 62 connects to the first main surface 42 of each of the thermoelectric conversion layers 40 via the first contact hole 52. Additionally, the first layer 62 covers the opening of the first contact hole 52 in a state in which each of the thermoelectric conversion layers 40, which is exposed from the insulating layer 50 at the bottom of the first contact hole 52, is not exposed from the first layer 62.

Figure 12:
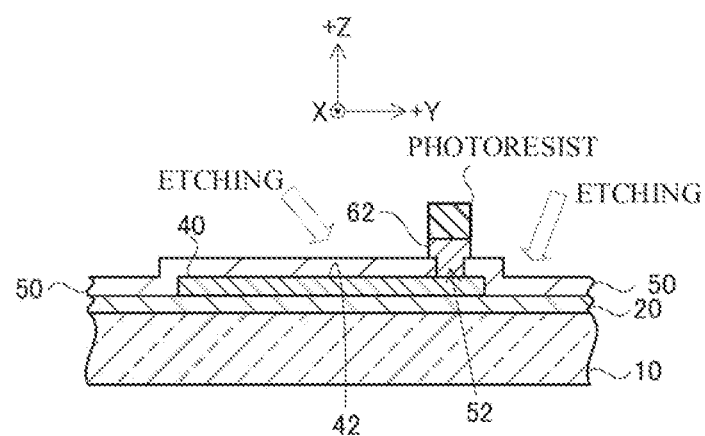
FIG. 12 is a schematic view for explaining the forming of the first layer of the first electrode according to Embodiment 1.

Specifically, firstly, the first contact hole 52 is filled in by sputtering to form a titanium thin film on the insulating layer 50. Next, the first layer 62 is formed in a comb teeth shape from the titanium thin film by photolithography and etching. In the present embodiment, when etching the titanium thin film, as illustrated in FIG. 12, the thermoelectric conversion layers 40 are covered by the insulating layer 50 and the first layer 62 (the titanium thin film) and, furthermore, the location of the titanium thin film that becomes the first layer 62 of each of the first electrodes 60 is covered by a photoresist. As such, the first layer 62 can be formed without exposing the thermoelectric conversion layers 40 to the etching solution.

Figure 13:
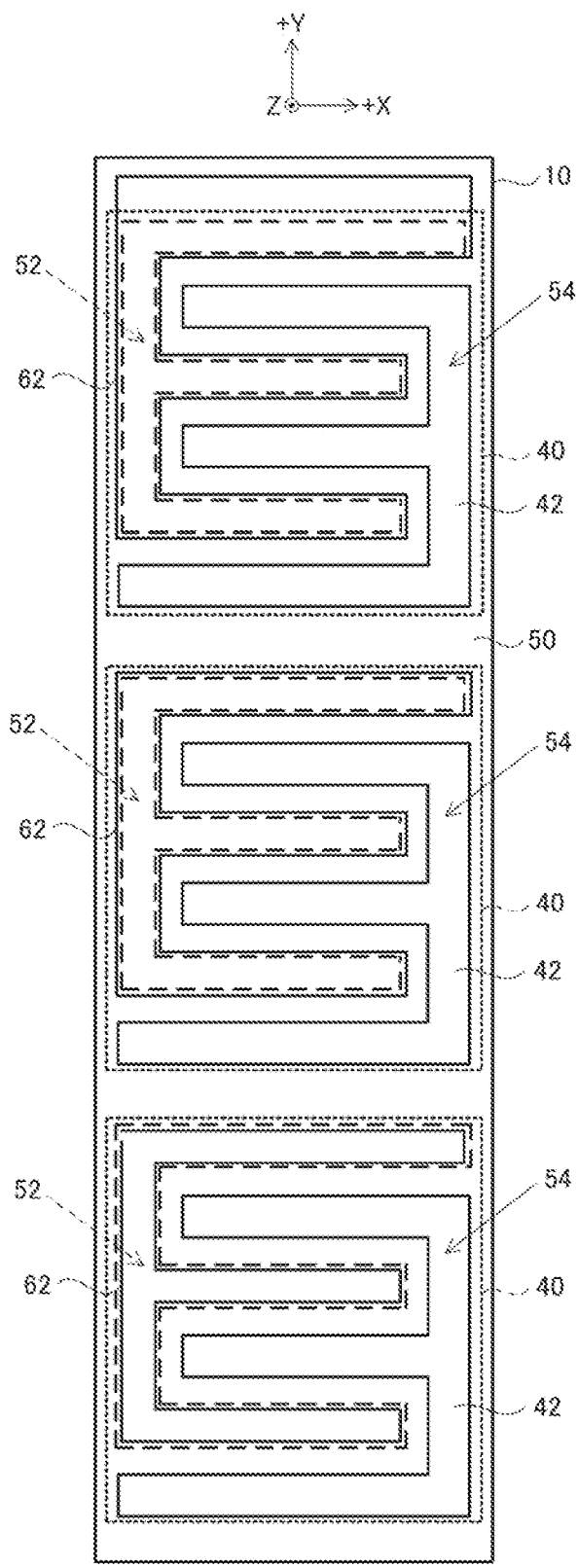
FIG. 13 is a top view illustrating a second contact hole according to Embodiment 1.

In step S60, the second contact hole 54 corresponding to each of the thermoelectric conversion layers 40 is formed on the insulating layer 50 by photolithography and etching. In the present embodiment, as illustrated in FIG. 13, the second contact hole 54 is formed in a comb teeth shape so as to match the shape of the second electrodes 70. Due to this configuration, the first main surface 42 of each of the thermoelectric conversion layers 40 is exposed from the insulating layer 50 in a comb teeth shape.

Figure 14:
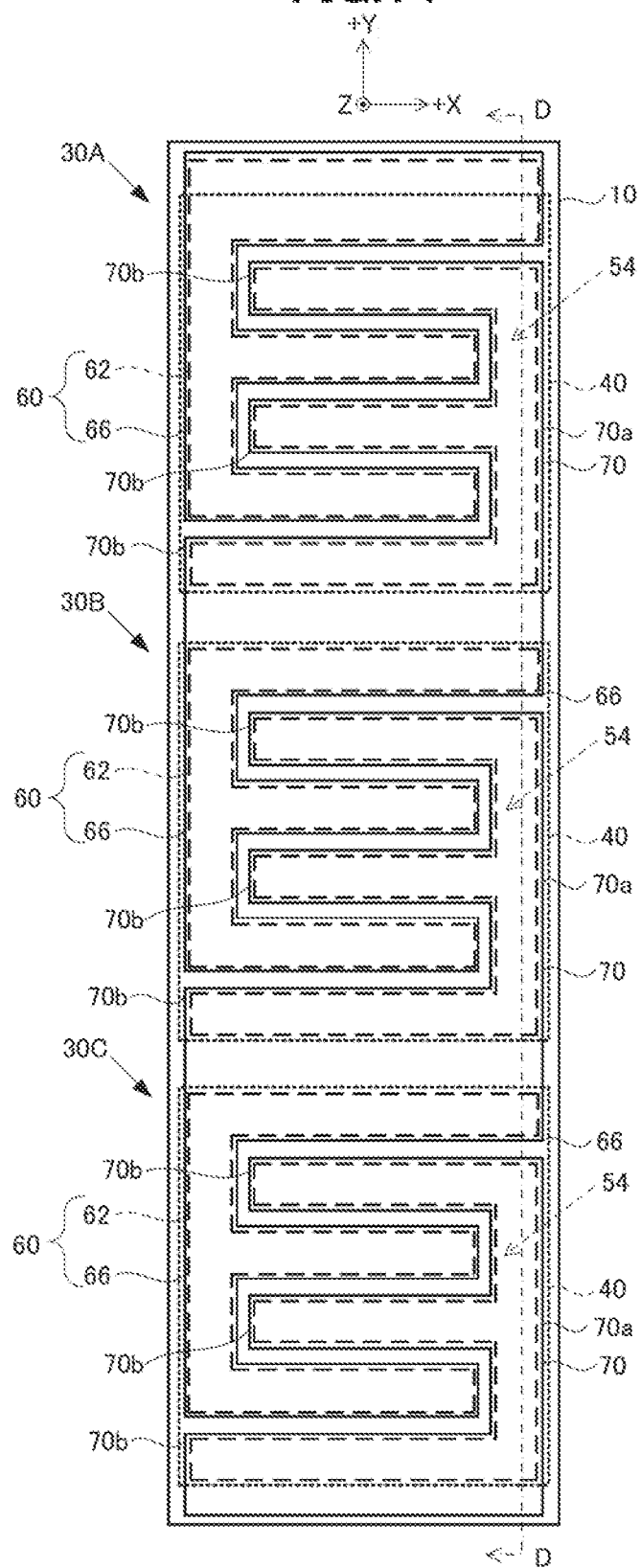
FIG. 14 is a top view illustrating a second electrode, and a second layer of the first electrode according to Embodiment 1.
Figure 15:
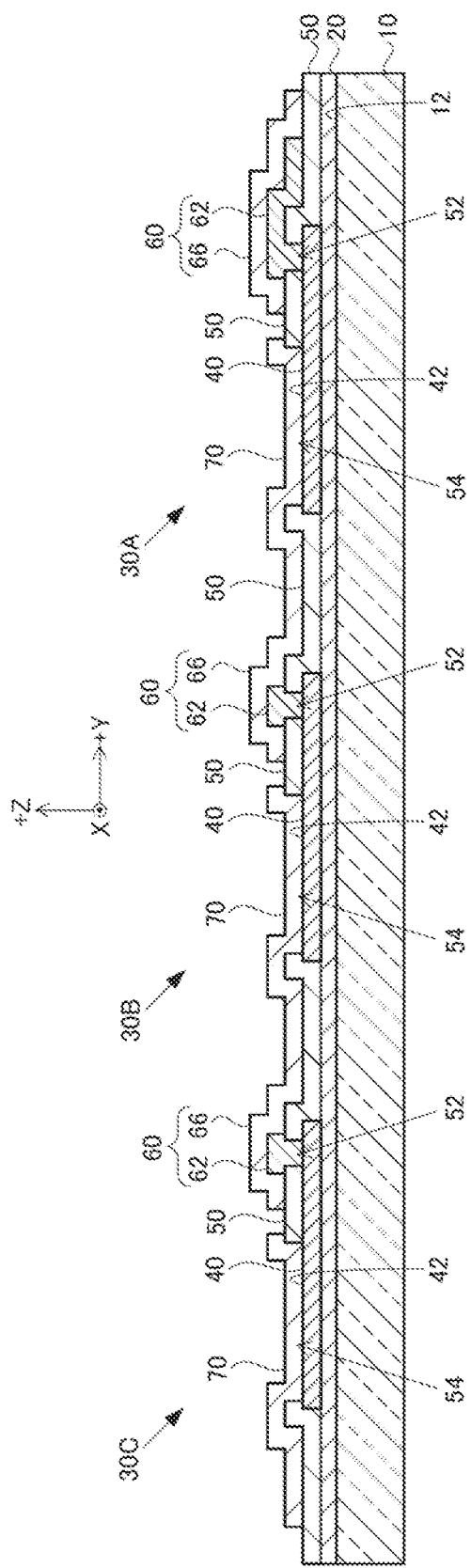
FIG. 15 is a cross-sectional view of the second electrode and the second layer of the first electrode illustrated in FIG. 14, taken along line D-D.

In step S70, as illustrated in FIGS. 14 and 15, the thermoelectric conversion cells 30A to 30C are formed by forming the plurality of second electrodes 70 corresponding to each of the thermoelectric conversion layers 40 together with the second layer 66 of the plurality of first electrodes 60 that covers the first layer 62 of each of the first electrodes 60 on the insulating layer 50. The second electrodes 70 connect to the first main surface 42 of each of the thermoelectric conversion layers 40 via the second contact hole 54. Additionally, each of the second electrodes 70 covers the opening of the second contact hole 54 in a state in which each of the thermoelectric conversion layers 40, which is exposed from the insulating layer 50 at the bottom of the second contact hole 54, is not exposed from the second electrode 70. The second layer 66 of each of the first electrodes 60 covers the first layer 62 of each of the first electrodes 60 in a state in which the first layer 62 is not exposed from the second layer 66. The second electrodes 70 and the second layer 66 are formed form a material (copper) that has a work function different from the work function of the material (titanium) forming the first layer 62 of the first electrodes 60. Note that, to facilitate comprehension, the first contact hole 52 is omitted in FIG. 14.

Furthermore, in the thermoelectric conversion cells 30A and 30B that are adjacent to each other, the second electrode 70 of the thermoelectric conversion cell 30A and the second layer 66 of the first electrode 60 of the thermoelectric conversion cell 30B are formed integrally and, as a result, the second electrode 70 of the thermoelectric conversion cell 30A and the first electrode 60 of the thermoelectric conversion cell 30B are connected one-to-one. Due to this configuration, the thermoelectric conversion cells 30A and 30B are connected in series. In the thermoelectric conversion cells 30B and 30C that are adjacent to each other, the second electrode 70 of the thermoelectric conversion cell 30B and the second layer 66 of the first electrode 60 of the thermoelectric conversion cell 30C are formed integrally and, as a result, the thermoelectric conversion cell 30B and the thermoelectric conversion cell 30C are connected in series. Due to this configuration, the thermoelectric conversion cells 30A to 30C are connected in series in one row.

Figure 16:
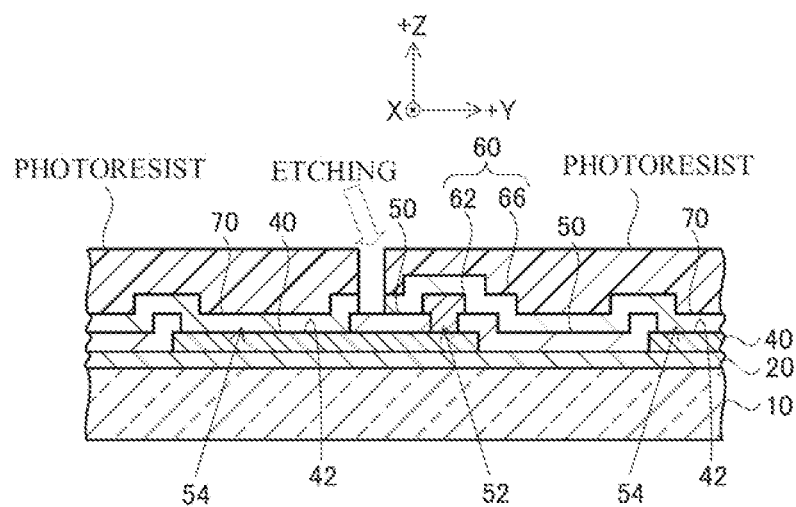
FIG. 16 is a schematic view for explaining the forming of the second electrode and the second layer of the first electrode according to Embodiment 1.

Specifically, firstly, the second contact hole 54 is filled in by sputtering to form a copper thin film on the insulating layer 50 and the first layer 62. Next, the second electrodes 70 and the second layer 66 are each formed, from the copper thin film, in a comb teeth shape by photolithography and etching. In this case, the second electrode 70 of one of the thermoelectric conversion cells that are adjacent to each other (the thermoelectric conversion cell 30A and the thermoelectric conversion cell 30B, and the thermoelectric conversion cell 30B and the thermoelectric conversion cell 30C) and the second layer 66 of the other thermoelectric conversion cell are formed integrally. In the present embodiment, when etching the copper thin film, as illustrated in FIG. 16, the thermoelectric conversion layers 40 are covered by the insulating layer 50, the first layer 62, and the second electrodes 70 (the copper thin film), the first layer 62 is covered by the second layer 66 (the copper thin film) and, furthermore, the locations of the copper thin film that become the second layer 66 of each of the first electrodes 60 and the second electrodes 70 are covered by photoresists. As such, second electrodes 70 can be formed without exposing the thermoelectric conversion layer 40 and the first layer 62 to the etching solution.

In step S80, in one example, the protection layer 80 is formed from photosensitive polyimide. Specifically, the photosensitive polyimide is applied and, then, the applied photosensitive polyimide is exposed and developed. Then, the developed photosensitive polyimide is fired to form the protection layer 80. Thus, the thermoelectric conversion element 100 can be manufactured.

As described above, with the thermoelectric conversion element 100, the second electrode 70 of one of the thermoelectric conversion cells that are adjacent to each other (the thermoelectric conversion cell 30A and the thermoelectric conversion cell 30B, and the thermoelectric conversion cell 30B and the thermoelectric conversion cell 30C) and the second layer 66 of the other thermoelectric conversion cell are formed integrally and, as a result, the thermoelectric conversion cells 30A to 30C are connected in series in one row. Since the thermoelectric conversion cells 30A to 30C are connected in series, the open-end voltage of the thermoelectric conversion element 100 can be increased.

With the thermoelectric conversion element 100, the first layer 62 can be formed by etching, without damaging the thermoelectric conversion layers 40 and the first layer 62. Additionally, the second layer 66 and the second electrodes 70 can be formed by etching without damaging the thermoelectric conversion layers 40, the first layer 62, the second layer 66, and the second electrodes 70. Accordingly, the thermoelectric conversion element 100 can easily be miniaturized by photolithography and etching. Additionally, the external shapes of the thermoelectric conversion cells 30A to 30C can be freely set by photolithography and etching. For example, since the thermoelectric conversion cells 30A to 30C include the first electrodes 60 and the second electrodes 70 that face each other, by setting the external shape of the thermoelectric conversion cells 30A to 30C to a rectangular shape as in the present embodiment, the thermoelectric conversion cells 30A to 30C can be efficiently arranged on the first main surface 12 of the substrate 10, and the waste of the area of the first main surface 12 of the substrate 10 can be eliminated. That is, the area ratio, of the first main surface 12 of the substrate 10, that the thermoelectric conversion cells 30A to 30C occupy can be increased. Furthermore, by miniaturizing the comb teeth shaped first electrodes 60 (the first layer 62) and second electrodes 70, the spacing between the first electrodes 60 and the second electrodes 70 can be narrowed and the perimeter length of the first electrodes 60 and the second electrodes 70 can be lengthened. As a result, the short-circuit current of the thermoelectric conversion element 100 can be increased.

With the thermoelectric conversion element 100, the selection, based on the work function, of the material forming the first layer 62 of each of the first electrodes 60 and the material forming the second layer 66 of each of the first electrodes 60 and the second electrodes 70 significantly affects the characteristics of the thermoelectric conversion element 100. However, in conventional thermoelectric conversion elements (for example, the thermoelectric conversion element described in Japanese Patent No. 6513476), when manufacturing the thermoelectric conversion element by photolithography and etching, the material forming the electrodes must be selected in consideration of the work function and also the galvanic effects related to etching.

In the present embodiment, when forming the first layer 62 of each of the first electrodes 60, and the second layer 66 of each of the first electrodes 60 and the second electrodes 70, only one of the materials (titanium or copper) forming the constituents is exposed and etched. Accordingly, the material forming the first layer 62 of each of the first electrodes 60 and the material forming the second layer 66 of each of the first electrodes 60 and the second electrodes 70 can be selected on the basis of the work function, without considering the galvanic effects related to etching. That is, the degree of freedom related to the selection of the material forming the first layer 62 of each of the first electrodes 60 and the material forming the second layer 66 of each of the first electrodes 60 and the second electrodes 70 is enhanced, and the characteristics of the thermoelectric conversion element 100 can easily be enhanced.

Embodiment 2

In Embodiment 1, the thermoelectric conversion cells 30A to 30C are arranged in one row. However, a configuration is possible in which the thermoelectric conversion cells are arranged in a matrix.

Figure 17:
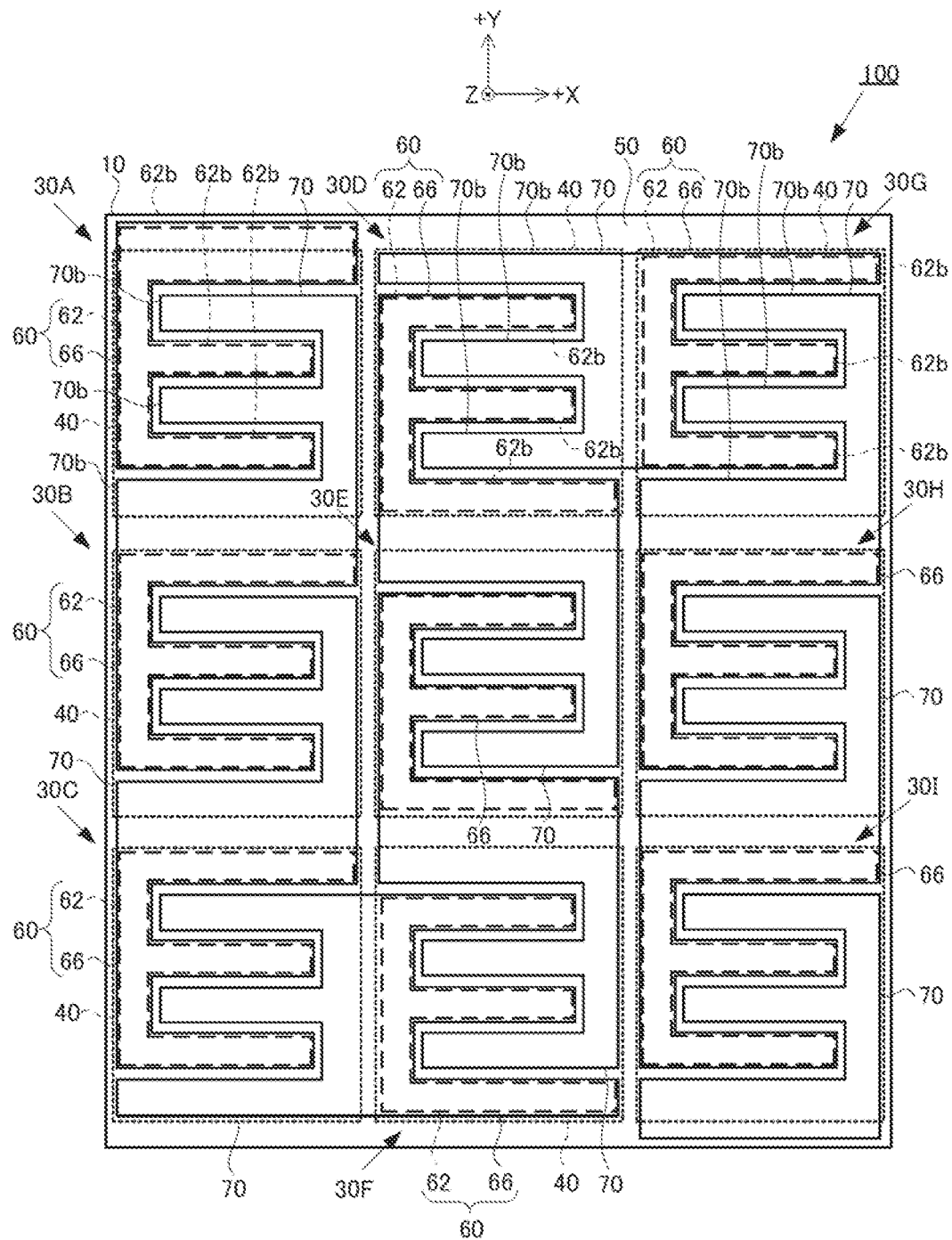
FIG. 17 is a top view illustrating a thermoelectric conversion element according to Embodiment 2.

As illustrated in FIG. 17, a thermoelectric conversion element 100 of the present embodiment includes a substrate 10, a base layer 20, nine thermoelectric conversion cells 30A to 30I, and a protection layer 80. The configurations of the substrate 10, the base layer 20, and the protection layer 80 of the present embodiment are the same as those in Embodiment 1. Note that, to facilitate comprehension, the base layer 20, the protection layer 80, a portion of the reference numerals, and the like are omitted from FIG. 17.

Additionally, the respective configurations of the thermoelectric conversion cells 30A to 30C and the thermoelectric conversion cells 30G to 30I are the same as the configurations of the thermoelectric conversion cells 30A to 30C of Embodiment 1. With the exception of the first comb teeth 62b of the first layer 62 and the second comb teeth 70b of each of the second electrodes 70 being arranged in the order of, from the +Y side, a second comb tooth 70b, a first comb tooth 62b, a second comb tooth 70b, a first comb tooth 62b, a second comb tooth 70b, and a first comb tooth 62b, the respective configurations of the thermoelectric conversion cells 30D to 30F are the same as the configurations of the thermoelectric conversion cells 30A to 30C of Embodiment 1. Hereinafter, arrangements and connections of the thermoelectric conversion cells 30A to 30I are described.

As illustrated in FIG. 17, the thermoelectric conversion cells 30A to 30I are arranged in a 3×3 matrix on the first main surface 12 of the substrate 10. Specifically, the thermoelectric conversion cells 30A to 30C are formed in a first row, the thermoelectric conversion cells 30D to 30F are formed in a second row, and the thermoelectric conversion cells 30G to 30I are formed in a third row. In the first row, as in Embodiment 1, the thermoelectric conversion cells 30A to 30C are arranged in the same direction and same orientation when viewed from above, with the first comb teeth 62b facing the +X direction and the second comb teeth 70b facing the −X direction. In the second row and the third row as well, the thermoelectric conversion cells 30D to 30I are arranged in the same direction and same orientation when viewed from above, with the first comb teeth 62b facing the +X direction and the second comb teeth 70b facing the −X direction.

As with the thermoelectric conversion cells 30A to 30C of Embodiment 1, with the thermoelectric conversion cells 30A to 30C of the first row, the second electrode 70 of the thermoelectric conversion cell 30A and the second layer 66 of the thermoelectric conversion cell 30B, and the second electrode 70 of the thermoelectric conversion cell 30B and the second layer 66 of the thermoelectric conversion cell 30C are formed integrally, thereby connecting the thermoelectric conversion cells 30A to 30C in series in one row.

With the thermoelectric conversion cells 30D to 30F of the second row, the second layer 66 of the thermoelectric conversion cell 30D and the second electrode 70 of the thermoelectric conversion cell 30E, and the second layer 66 of the thermoelectric conversion cell 30E and the second electrode 70 of the thermoelectric conversion cell 30F are formed integrally, thereby connecting the thermoelectric conversion cells 30D to 30F in series in one row. With the thermoelectric conversion cells 30G to 30I, the second electrode 70 of the thermoelectric conversion cell 30G and the second layer 66 of the thermoelectric conversion cell 30H, and the second electrode 70 of the thermoelectric conversion cell 30H and the second layer 66 of the thermoelectric conversion cell 30I are formed integrally, thereby connecting the thermoelectric conversion cells 30G to 30I in series in one row.

In the present embodiment, the second electrode 70 of the thermoelectric conversion cell 30C of the first row and the second layer 66 of the thermoelectric conversion cell 30F of the second row adjacent to the thermoelectric conversion cell 30C are formed integrally and, as a result, the thermoelectric conversion cells 30A to 30C of the first row and the thermoelectric conversion cells 30D to 30F of the second row are connected in series. Additionally, the second electrode 70 of the thermoelectric conversion cell 30D of the second row and the second layer 66 of the thermoelectric conversion cell 30G of the third row adjacent to the thermoelectric conversion cell 30D are formed integrally and, as a result, the thermoelectric conversion cells 30D to 30F of the second row and the thermoelectric conversion cells 30G to 30I of the third row are connected in series. Due to this configuration, the thermoelectric conversion cells 30A to 30I are connected in series.

With the thermoelectric conversion element 100 of the present embodiment, as with the thermoelectric conversion element 100 of Embodiment 1, the second electrode 70 of one of the thermoelectric conversion cells that are adjacent to each other and the second layer 66 of the other thermoelectric conversion cell are formed integrally and, as a result, the thermoelectric conversion cells 30A to 30I are connected in series. Since the thermoelectric conversion cells 30A to 30I are connected in series, the open-end voltage of the thermoelectric conversion element 100 can be increased.

Additionally, as in Embodiment 1, the thermoelectric conversion element 100 of the present embodiment can easily be miniaturized by photolithography and etching. Furthermore, the area ratio, of the first main surface 12 of the substrate 10, that the thermoelectric conversion cells 30A to 30I occupy can be increased. The spacing between the first electrodes 60 and the second electrodes 70 is narrowed and the perimeter length of the first electrodes 60 and the second electrodes 70 is lengthened, thereby making it possible to increase the short-circuit current of the thermoelectric conversion element 100 of the present embodiment.

As in Embodiment 1, the degree of freedom related to the selection of the material forming the first layer 62 of each of the first electrodes 60 and the material forming the second layer 66 of each of the first electrodes 60 and the second electrodes 70 is high and, as such, the characteristics of the thermoelectric conversion element 100 can easily be enhanced.

Embodiment 3

In Embodiment 1 and Embodiment 2, the first layer 62 of each of the first electrodes 60 and the second electrodes 70 have comb teeth shapes. However, a configuration is possible in which the first layer 62 of each of the first electrodes 60 and the second electrodes 70 have other shapes.

A thermoelectric conversion element 100 of the present embodiment includes a substrate 10, a base layer 20, nine thermoelectric conversion cells 32A to 32I, and a protection layer 80. The configurations of the substrate 10, the base layer 20, and the protection layer 80 of the present embodiment are the same as those in Embodiment 1.

Figure 18:
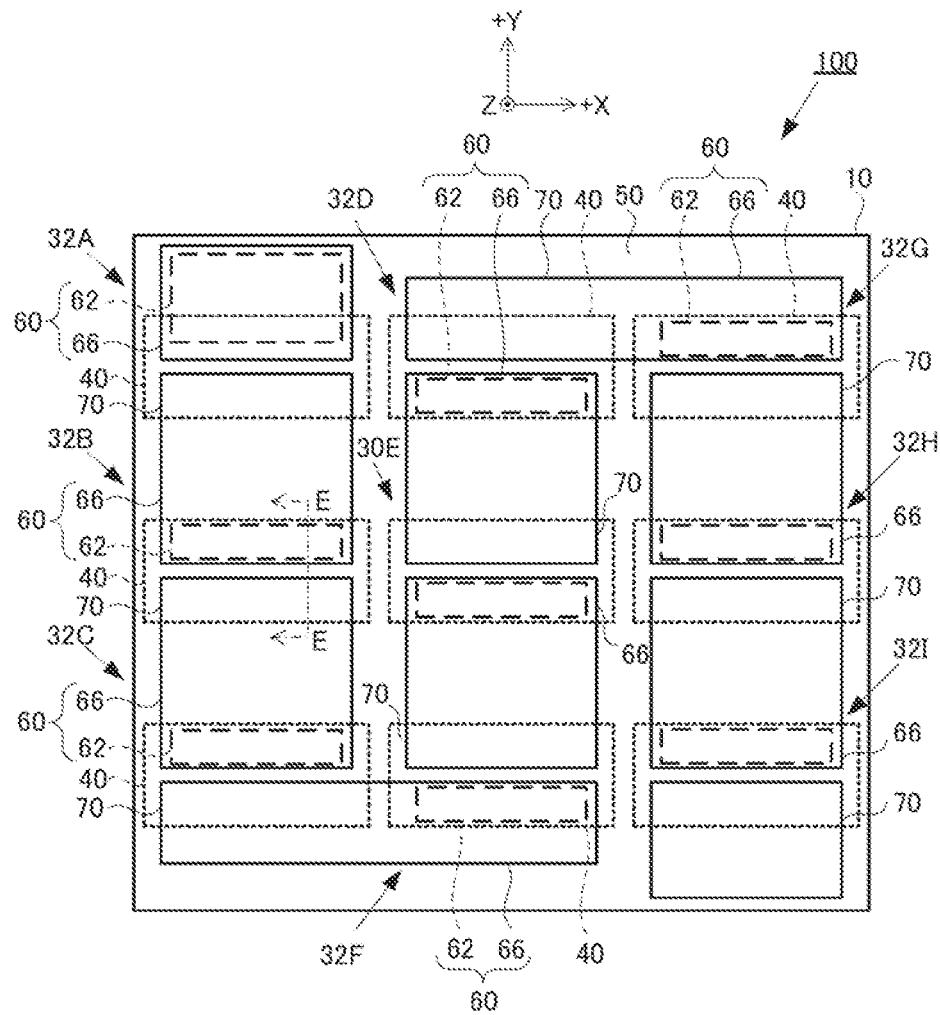
FIG. 18 is a top view illustrating a thermoelectric conversion element according to Embodiment 3.
Figure 19:
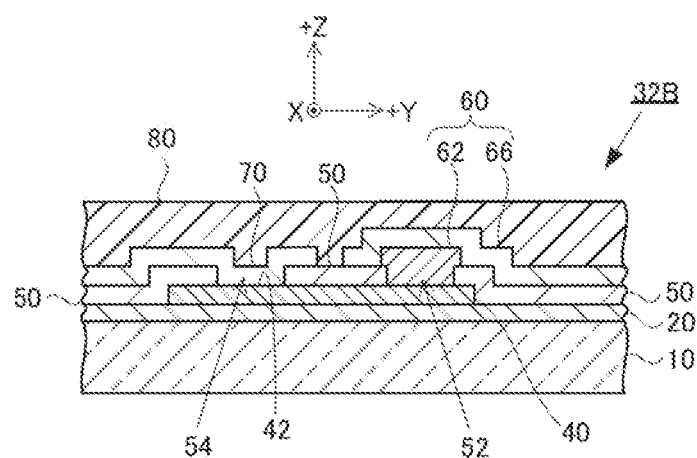
FIG. 19 is a cross-sectional view of the thermoelectric conversion element illustrated in FIG. 18, taken along line E-E.

As with the thermoelectric conversion cells 30A to 30C of Embodiment 1, each of the thermoelectric conversion cells 32A to 32I includes a thermoelectric conversion layer 40, an insulating layer 50, a first electrode 60, and a second electrode 70. The first electrode 60 includes a first layer 62 and a second layer 66. As illustrated in FIGS. 18 and 19, with the exception of the first layer 62 of the first electrode 60 and the second electrode 70 having a rectangular shape that is long in the X direction, the configurations of the thermoelectric conversion cells 32A to 32I are the same as those of the thermoelectric conversion cells 30A to 30C of Embodiment 1.

Note that, with the thermoelectric conversion cells 32A to 32C and 32G to 32I, the first electrodes 60 are positioned on the +Y side, and the second electrodes 70 are positioned on the −Y side. With the thermoelectric conversion cells 32D to 32F, the first electrodes 60 are positioned on the −Y side, and the second electrodes 70 are positioned on the +Y side. Additionally, to facilitate comprehension, the protection layer 80, a portion of the reference numerals, and the like are omitted from FIG. 18. FIG. 19 illustrates a cross-section of the thermoelectric conversion cell 32B as an example of the thermoelectric conversion cells 32A to 32I.

As with the thermoelectric conversion cells 30A to 30I of Embodiment 2, the thermoelectric conversion cells 32A to 32I are arranged in a 3×3 matrix, and are connected in series.

With the thermoelectric conversion cells 32A to 32C of the first row, the second electrode 70 of the thermoelectric conversion cell 32A and the second layer 66 of the thermoelectric conversion cell 32B, and the second electrode 70 of the thermoelectric conversion cell 32B and the second layer 66 of the thermoelectric conversion cell 32C are formed integrally, thereby connecting the thermoelectric conversion cells 32A to 32C in series in one row. With the thermoelectric conversion cells 32D to 32F of the second row, the second layer 66 of the thermoelectric conversion cell 32D and the second electrode 70 of the thermoelectric conversion cell 32E, and the second layer 66 of the thermoelectric conversion cell 32E and the second electrode 70 of the thermoelectric conversion cell 32F are formed integrally, thereby connecting the thermoelectric conversion cells 32D to 32F in series in one row. With the thermoelectric conversion cells 32G to 32I of the third row, the second electrode 70 of the thermoelectric conversion cell 32G and the second layer 66 of the thermoelectric conversion cell 32H, and the second electrode 70 of the thermoelectric conversion cell 32H and the second layer 66 of the thermoelectric conversion cell 32I are formed integrally, thereby connecting the thermoelectric conversion cells 32G to 32I in series in one row.

Furthermore, the second electrode 70 of the thermoelectric conversion cell 32C of the first row and the second layer 66 of the thermoelectric conversion cell 32F of the second row adjacent to the thermoelectric conversion cell 32C are formed integrally and, as a result, the thermoelectric conversion cells 32A to 32C of the first row and the thermoelectric conversion cells 32D to 32F of the second row are connected in series. The second electrode 70 of the thermoelectric conversion cell 32D of the second row and the second layer 66 of the thermoelectric conversion cell 32G of the third row adjacent to the thermoelectric conversion cell 32D are formed integrally and, as a result, the thermoelectric conversion cells 32D to 32F of the second row and the thermoelectric conversion cells 32G to 32I of the third row are connected in series. Due to this configuration, the thermoelectric conversion cells 32A to 32I are connected in series.

In the present embodiment, the first layer 62 of each of the first electrodes 60, and the second electrode 70 have a rectangular shape and, as such, when designed under the same rules as Embodiments 1 and 2, the area, of the first main surface 12 of the substrate 10, that the thermoelectric conversion cells 32A to 32I occupy can easily be reduced. In the present embodiment, the nine thermoelectric conversion cells 32A to 32I are arranged in a 3×3 matrix, but the number of thermoelectric conversion cells connected in series can in increased by reducing the area occupied by the thermoelectric conversion cells on the first main surface 12 of the substrate 10. The open-end voltage of the thermoelectric conversion element 100 can be increased by increasing the number of thermoelectric conversion cells connected in series. When using the thermoelectric conversion element 100 in a sensor application such as a heat flux sensor, it is preferable that the open-end voltage of the thermoelectric conversion element 100 be increased in order to increase the output voltage.

Modified Examples

Embodiments have been described, but various modifications can be made to the present disclosure without departing from the spirit and scope of the present disclosure.

For example, the substrate 10 is not limited to a glass substrate. A configuration is possible in which the substrate 10 is formed from a film that has insulating properties (for example, a polyimide film).

The thermoelectric conversion elements 100 of Embodiments 1 to 3 include the base layer 20. However, a configuration is possible in which the thermoelectric conversion element 100 does not include the base layer 20. The thermoelectric conversion layer 40 may be formed direction on the first main surface 12 of a substrate 10 that has insulating properties. Furthermore, a configuration is possible in which the thermoelectric conversion element 100 does not include the protection layer 80.

In Embodiments 1 to 3, the first layer 62 of each of the first electrodes 60 are formed from a material that has a small work function, and the second layer 66 of each of the first electrodes 60 and the second electrodes 70 are formed from a material that has a large work function. However, with the thermoelectric conversion element 100, it is sufficient that the work function of the material forming the first layer 62 of each of the first electrodes 60 and the work function of the material forming the second layer 66 of each of the first electrodes 60 and the second electrodes 70 are different.

For the materials forming the first layer 62 of each of the first electrodes 60, and the second layer 66 of each of the first electrodes 60 and the second electrodes 70, examples of the material that has a small work function include cesium (Cs), aluminum (Al), and the like, and examples of the material that has a large work function include nickel (Ni).

In Embodiments 1 to 3, a configuration is possible in which a protective plating is applied to the surface of each of the first electrodes 60 (the second layer 66) and the second electrodes 70 that are exposed through the terminal openings 85 of the protection layer 80.

Figure 20:
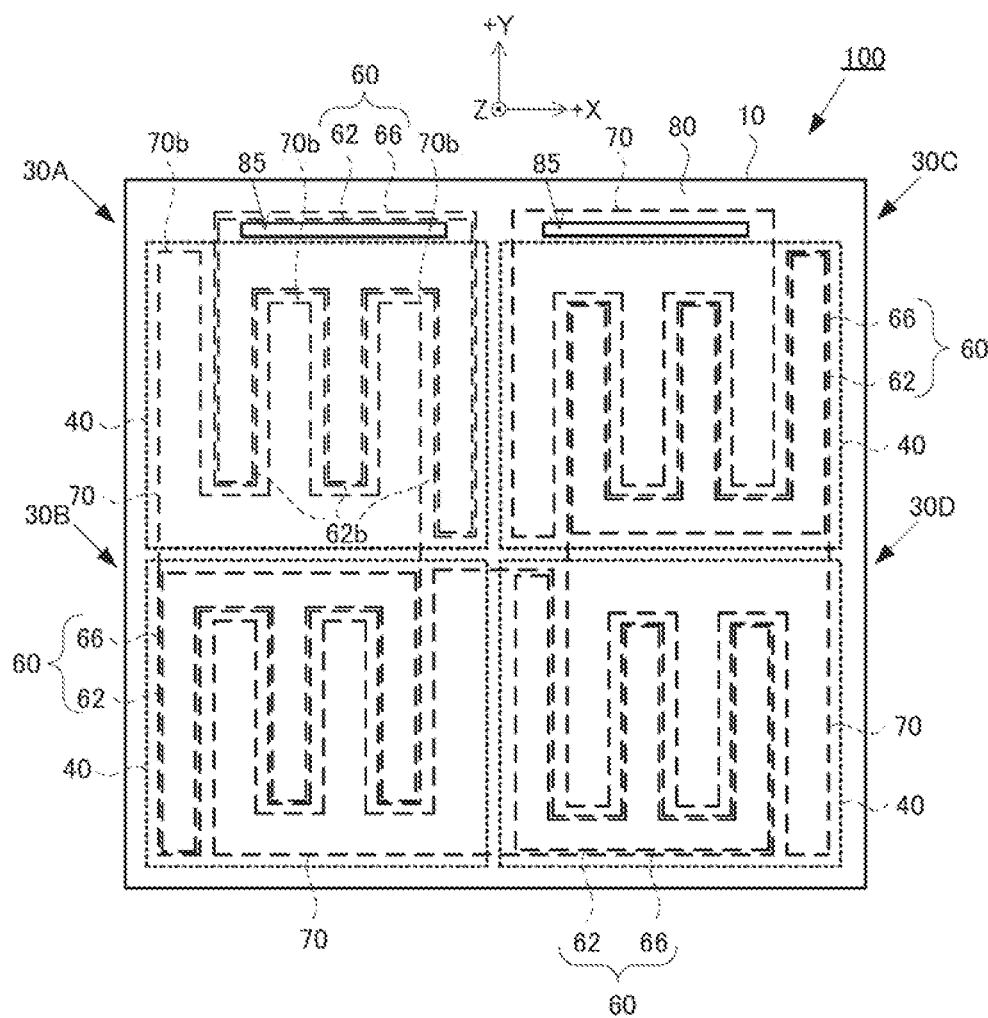
FIG. 20 is a top view illustrating a thermoelectric conversion element according to a modified example.

With the thermoelectric conversion cells 30A to 30C of Embodiment 1 and the thermoelectric conversion cells 30A to 30I of Embodiment 2, the first comb teeth 62$b$ and the second comb teeth 70$b$ extend in the X direction. However, as illustrated in FIG. 20, a configuration is possible in which the first comb teeth 62$b$ and the second comb teeth 70$b$ extend in the Y direction. To facilitate comprehension, the insulating layer 50, a portion of the reference numerals, and the like are omitted from FIG. 20.

Figure 21:
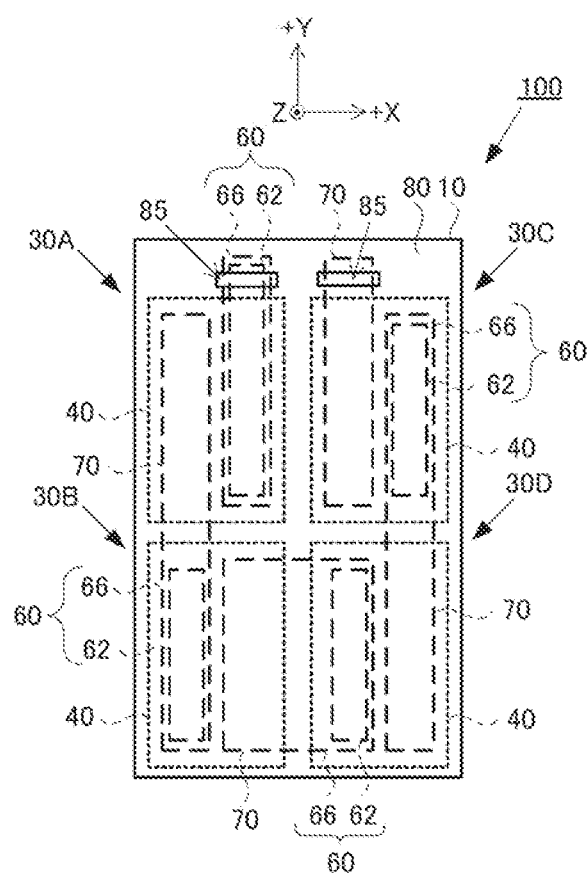
FIG. 21 is a top view illustrating a thermoelectric conversion element according to a modified example.

With the thermoelectric conversion cells 30A to 30I of Embodiment 3, the first layer 62 of each of the first electrodes 60 and the second electrodes 70 have rectangular shapes that are long in the X direction. As illustrated in FIG. 21, a configuration is possible in which the first layer 62 of each of the first electrodes 60 and the second electrodes 70 have rectangular shapes that are long in the Y direction. To facilitate comprehension, the insulating layer 50, a portion of the reference numerals, and the like are omitted from FIG. 21.

Figure 22:
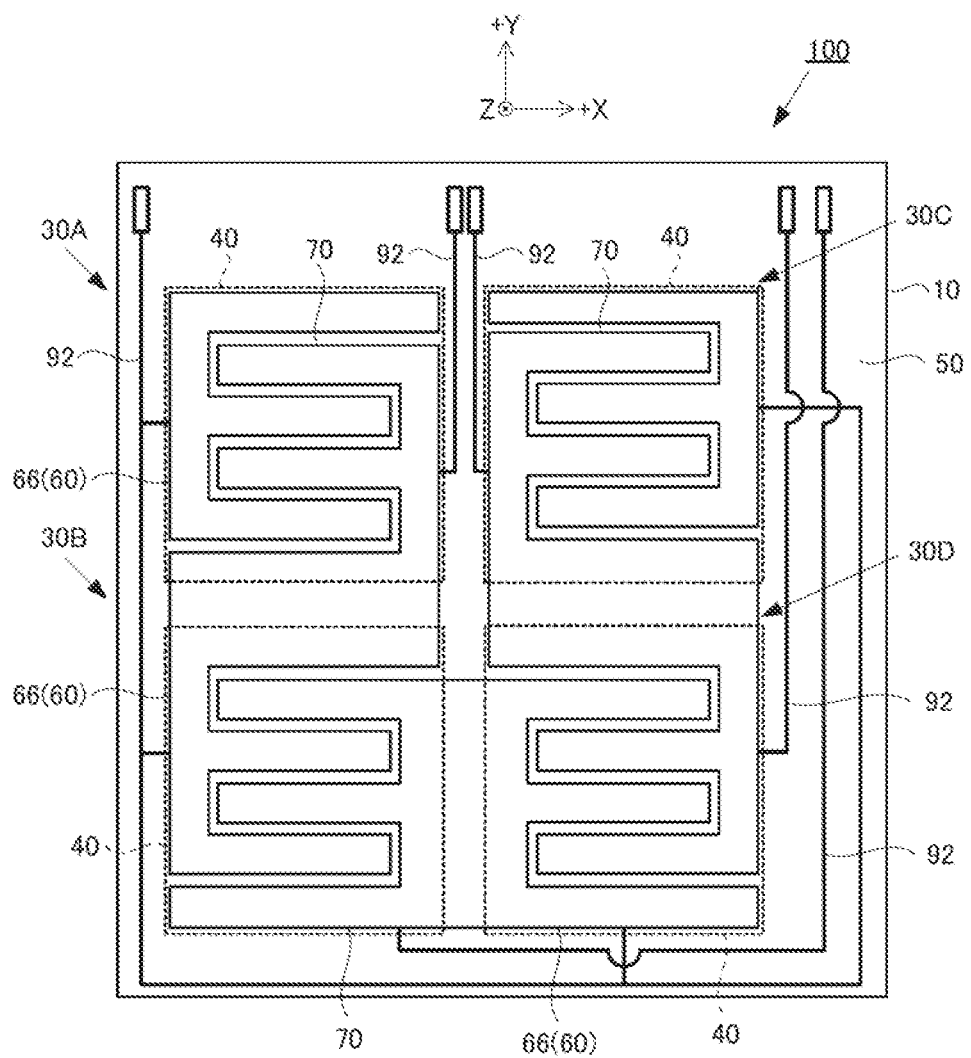
FIG. 22 is a top view illustrating a thermoelectric conversion element according to a modified example.

With the thermoelectric conversion element 100 of Embodiment 2, the heat flux of the entire region in which the thermoelectric conversion cells 30A to 30I are arranged can be detected by measuring the output voltage of the thermoelectric conversion cells 30A to 30I that are connected in series. As illustrated in FIG. 22, a configuration is possible in which the thermoelectric conversion element 100 detects the heat flux for every region in which each of the thermoelectric conversion cells 30A to 30D are arranged by measuring, via a wiring 92, the output voltage for every second electrode 70 of the thermoelectric conversion cells 30A to 30D that are connected in series. As a result, the thermoelectric conversion element 100 can detects the heat flux of the entire region in which the thermoelectric conversion cells 30A to 30D are arranged and, also, can detect a distribution of the heat flux in the region in which the thermoelectric conversion cells 30A to 30D are arranged. To facilitate comprehension, the first layer 62 of each of the first electrodes 60, the protection layer 80, a portion of the reference numerals, and the like are omitted from FIG. 22.

Figure 23:
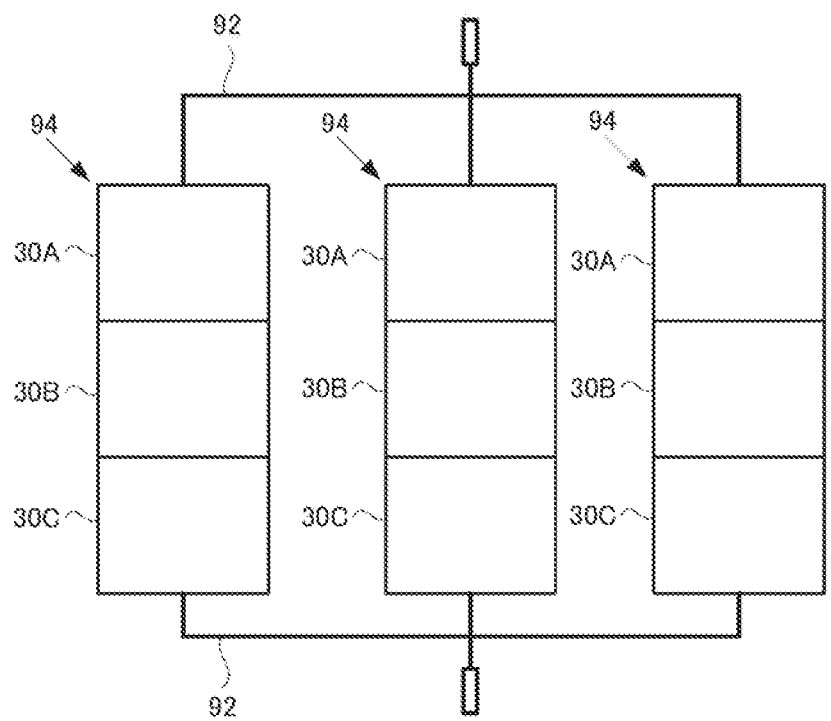
FIG. 23 is a schematic view illustrating the connection of a thermoelectric conversion element according to a modified example.

With the thermoelectric conversion element 100, as illustrated in FIG. 23, a configuration is possible in which cell groups 94, obtained by connecting the thermoelectric conversion cells 30A to 30C in series, are connected in parallel via the wiring 92. Due to this configuration, the thermoelectric conversion element 100 can detect the heat flux even when a portion of the thermoelectric conversion cells 30A to 30C disconnects. To facilitate comprehension, in FIG. 23, the thermoelectric conversion cells 30A to 30C are illustrated in a simplified manner, and the substrate 10, the protection layer 80, and the like are omitted.

Figure 24:
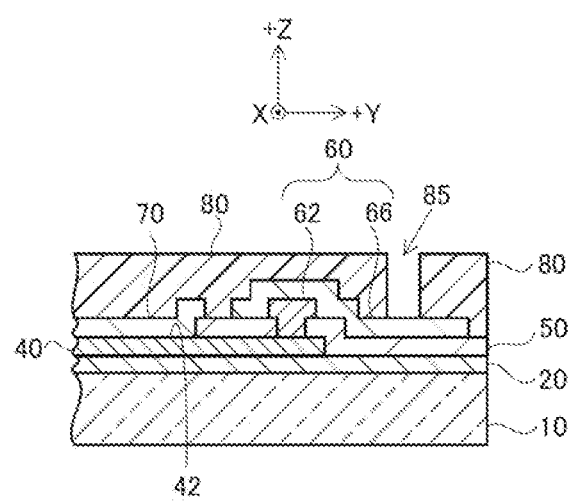
FIG. 24 is a cross-sectional view illustrating a first electrode in a terminal opening according to a modified example.
Figure 25:
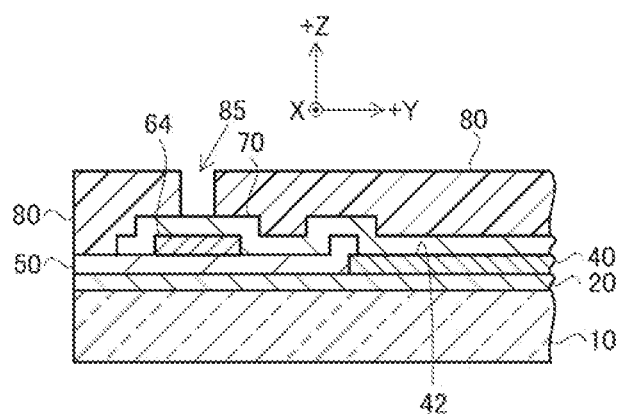
FIG. 25 is a cross-sectional view illustrating a second electrode in a terminal opening according to a modified example.

With the first electrodes 60 exposed from the terminal openings 85 of Embodiment 1, the first layer 62 and the second layer 66 are stacked. However, as illustrated in FIG. 24, a configuration is possible in which the first electrodes 60 exposed through the terminal openings 85 are formed from only the second layer 66. Additionally, as illustrated in FIG. 25, a configuration is possible in which a thin film 64 for forming the first layer 62 of each of the first electrodes 60 remains under the second electrodes 70 that are exposed through the terminal openings 85.

In Embodiment 1, the terminal openings 85 for connecting the thermoelectric conversion element 100 to an external device are arranged on different sides of the thermoelectric conversion element 100, however, the position, shape, and the like of the terminal openings 85 can be determined as desired. Additionally, the connection mode, connection position, and the like between the thermoelectric conversion element 100 and the external device can be determined as desired. Furthermore, the number, arrangement, connection path, and the like of the thermoelectric conversion cells of the thermoelectric conversion element 100 can be determined as desired. The number, arrangement, connection path, and the like of the thermoelectric conversion cells of the thermoelectric conversion element 100 may be set in accordance with the use and/or installation location of the thermoelectric conversion element 100.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A thermoelectric conversion element comprising:
   a substrate; and
   a plurality of thermoelectric conversion cells provided on a main surface of the substrate, wherein
   each of the thermoelectric conversion cells includes
      a thermoelectric conversion layer formed on the main surface of the substrate,
      an insulating layer covering the thermoelectric conversion layer,
      a first electrode formed on the insulating layer and including a first layer connecting to a main surface of the thermoelectric conversion layer via a first contact hole of the insulating layer, and a second layer formed on the insulating layer and covering the first layer, and
      a second electrode formed on the insulating layer and connecting to the main surface of the thermoelectric conversion layer via a second contact hole of the insulating layer,
   the second layer covers the first layer in a state in which the first layer is not exposed from the second layer,
   the second layer and the second electrode are formed from an identical material that has a work function that is different from a work function of a material forming the first layer, and
   in the thermoelectric conversion cells that are adjacent to each other, the second layer of one of the thermoelectric conversion cells and the second electrode of another of the thermoelectric conversion cells are formed integrally, the first electrode and the second electrode are connected one-to-one, and the plurality of thermoelectric conversion cells is connected in series.

2. The thermoelectric conversion element according to claim 1, wherein
   the first layer covers an opening of the first contact hole in a state in which the thermoelectric conversion layer is not exposed from the insulating layer, and
   the second electrode covers an opening of the second contact hole in a state in which the thermoelectric conversion layer is not exposed from the insulating layer.

3. The thermoelectric conversion element according to claim 1, wherein
   the first layer includes a first base and a plurality of first comb teeth extending from the first base,
   the second electrode includes a second base and a plurality of second comb teeth extending from the second base, and
   the first comb teeth and the second comb teeth are arranged facing each other in an alternating manner on the main surface of the thermoelectric conversion layer.

4. The thermoelectric conversion element according to claim 1, wherein the plurality of thermoelectric conversion cells is arranged in a matrix.

* * * * *